US010558129B2

(12) United States Patent
Kruizinga et al.

(10) Patent No.: US 10,558,129 B2
(45) Date of Patent: Feb. 11, 2020

(54) MASK ASSEMBLY

(71) Applicant: ASML Netherlands B.V., Veldhoven (NL)

(72) Inventors: Matthias Kruizinga, Herten (NL); Maarten Mathijs Marinus Jansen, Eindhoven (NL); Jorge Manuel Azeredo Lima, Veldhoven (NL); Erik Willem Bogaart, Someren (NL); Derk Servatius Gertruda Brouns, Herentals (BE); Marc Bruijn, Eindhoven (NL); Richard Joseph Bruls, Eindhoven (NL); Jeroen Dekkers, Eindhoven (NL); Paul Janssen, Eindhoven (NL); Mohammad Reza Kamali, Eindhoven (NL); Ronald Harm Gunther Kramer, Hooge Mierde (NL); Robert Gabriël Maria Lansbergen, Schiedam (NL); Martinus Hendrikus Antonius Leenders, Rhoon (NL); Matthew Lipson, Wilton, CT (US); Erik Roelof Loopstra, Eindhoven (NL); Joseph H. Lyons, Wilton, CT (US); Stephen Roux, New Fairfield, CT (US); Gerrit Van Den Bosch, Geldermalsen (NL); Sander Van Den Heijkant, Valkenswaard (NL); Sandra Van Der Graaf, 's-Hertogenbosch (NL); Frits Van Der Meulen, Eindhoven (NL); Jérôme François Sylvain Virgile Van Loo, Tilburg (NL); Beatrijs Louise Marie-Joseph Katrien Verbrugge, Kasterlee (BE)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 152 days.

(21) Appl. No.: 15/526,654

(22) PCT Filed: Nov. 16, 2015

(86) PCT No.: PCT/EP2015/076687
§ 371 (c)(1),
(2) Date: May 12, 2017

(87) PCT Pub. No.: WO2016/079051
PCT Pub. Date: May 26, 2016

(65) Prior Publication Data
US 2018/0329314 A1 Nov. 15, 2018

Related U.S. Application Data

(60) Provisional application No. 62/183,342, filed on Jun. 23, 2015, provisional application No. 62/149,176, filed on Apr. 17, 2015, provisional application No. 62/126,173, filed on Feb. 27, 2015, provisional application No. 62/110,841, filed on Feb. 2, 2015, provisional application No. 62/108,348, filed on Jan. 27, 2015, provisional application No. 62/080,561, filed on Nov. 17, 2014.

(51) Int. Cl.
*G03F 7/20* (2006.01)
*G03F 1/64* (2012.01)
*G03F 1/22* (2012.01)

(52) U.S. Cl.
CPC ............ *G03F 7/70983* (2013.01); *G03F 1/22* (2013.01); *G03F 1/64* (2013.01); *G03F 7/70825* (2013.01)

(58) Field of Classification Search
CPC .......... G03F 1/22; G03F 1/64; G03F 7/70825; G03F 7/70983
USPC .......................................................... 430/5
See application file for complete search history.

(56) References Cited

U.S. PATENT DOCUMENTS

| | | |
|---|---|---|
| 4,833,051 A | 5/1989 | Imamura |
| 5,576,125 A | 11/1996 | Bih |
| 6,192,100 B1 | 2/2001 | Acosta et al. |
| 6,197,454 B1 | 3/2001 | Yan |
| 6,665,049 B1 | 12/2003 | Takahashi |
| 6,754,303 B2 | 6/2004 | Kasumi |
| 6,894,766 B1 | 5/2005 | West et al. |
| 6,911,283 B1 | 6/2005 | Gordon et al. |
| 6,912,043 B2 | 6/2005 | Galburt |

(Continued)

FOREIGN PATENT DOCUMENTS

| | | |
|---|---|---|
| CN | 101876786 A | 11/2010 |
| CN | 102141727 A | 8/2011 |

(Continued)

OTHER PUBLICATIONS

International Search Report and Written Opinion directed to International Patent Application No. PCT/EP2015/076687, dated Aug. 3, 2016; 19 pages.

(Continued)

*Primary Examiner* — Christopher G Young
(74) *Attorney, Agent, or Firm* — Sterne, Kessler, Goldstein & Fox P.L.L.C.

(57) ABSTRACT

A mask assembly suitable for use in a lithographic process, the mask assembly comprising a patterning device; and a pellicle frame configured to support a pellicle and mounted on the patterning device with a mount; wherein the mount is configured to suspend the pellicle frame relative to the patterning device such that there is a gap between the pellicle frame and the patterning device; and wherein the mount provides a releasably engageable attachment between the patterning device and the pellicle frame.

44 Claims, 13 Drawing Sheets

(56) References Cited

U.S. PATENT DOCUMENTS

| | | |
|---|---|---|
| 7,507,264 B2 | 3/2009 | Matsumoto |
| 8,133,640 B2 | 3/2012 | Lee et al. |
| 8,139,199 B2 | 3/2012 | Noboru |
| 8,338,060 B2 | 12/2012 | Sekihara |
| 10,139,725 B2 | 11/2018 | Wiley et al. |
| 10,268,126 B2 | 4/2019 | Shibazaki |
| 2002/0098420 A1 | 7/2002 | Eynon |
| 2002/0154285 A1 | 10/2002 | Ramamoorthy et al. |
| 2002/0155359 A1 | 10/2002 | Muzio et al. |
| 2003/0020894 A1 | 1/2003 | Wang |
| 2003/0058424 A1 | 3/2003 | Ramamoorthy et al. |
| 2003/0227605 A1 | 12/2003 | Del Puerto et al. |
| 2004/0137339 A1 | 7/2004 | Zhang et al. |
| 2005/0243452 A1 | 11/2005 | Gallagher et al. |
| 2006/0246234 A1 | 11/2006 | Meyers et al. |
| 2008/0213679 A1 | 9/2008 | Miyakawa et al. |
| 2008/0259291 A1 | 10/2008 | Banine et al. |
| 2009/0029268 A1 | 1/2009 | Lin et al. |
| 2010/0279212 A1 | 11/2010 | Shirasaki |
| 2010/0323302 A1 | 12/2010 | Hanazaki et al. |
| 2012/0140199 A1 | 6/2012 | Hotzel |
| 2013/0065160 A1 | 3/2013 | Lao |
| 2013/0088699 A1 | 4/2013 | Yakunin et al. |
| 2013/0329209 A1 | 12/2013 | Shibazaki |
| 2019/0025717 A1 | 1/2019 | Van Der Meulen et al. |

FOREIGN PATENT DOCUMENTS

| | | |
|---|---|---|
| CN | 103246157 A | 8/2013 |
| CN | 103728841 A | 4/2014 |
| CN | 104024942 A | 9/2014 |
| EP | 1445652 A2 | 8/2004 |
| JP | S61145936 U | 9/1986 |
| JP | S61245163 A | 10/1986 |
| JP | H03042153 U | 4/1991 |
| JP | H09-204039 A | 8/1997 |
| JP | H11194481 A | 7/1999 |
| JP | H11202476 A | 7/1999 |
| JP | H11295880 A | 10/1999 |
| JP | 2003-059801 A | 2/2003 |
| JP | 2004-153122 A | 5/2004 |
| JP | 2004-179515 A | 6/2004 |
| JP | 2005-070191 A | 3/2005 |
| JP | 2005509185 A | 4/2005 |
| JP | 2005195992 A | 7/2005 |
| JP | 2006003620 A | 1/2006 |
| JP | 2007-042799 A | 2/2007 |
| JP | 2010-217698 A | 9/2010 |
| JP | 2011-137951 A | 7/2011 |
| JP | 2014527291 T | 10/2014 |
| JP | 2014-215588 A | 11/2014 |
| KR | 2009-0022165 A | 3/2009 |
| KR | 20110080844 A | 7/2011 |
| KR | 2012-0113176 A | 10/2012 |
| TW | 2014-43554 A | 11/2014 |
| WO | WO 2015/182483 A1 | 12/2015 |

OTHER PUBLICATIONS

International Search Report and Written Opinion directed to International Patent Application No. PCT/EP2015/076688, dated Aug. 2, 2016; 15 pages.

International Preliminary Report on Patentability directed to related International Patent Application No. PCT/EP2015/076688, dated May 23, 2017; 9 pages.

International Preliminary Report on Patentability directed to related International Patent Application No. PCT/EP2015/076687, dated May 23, 2017; 13 pages.

Non-Final Office Action directed to related U.S. Appl. No. 15/526,639, dated Feb. 11, 2019; 9 pages.

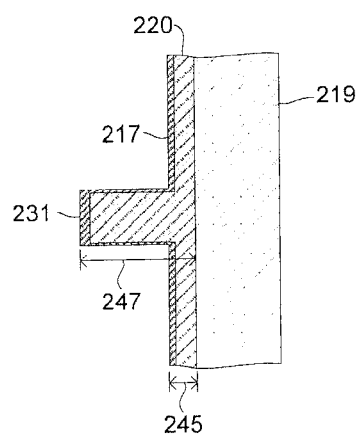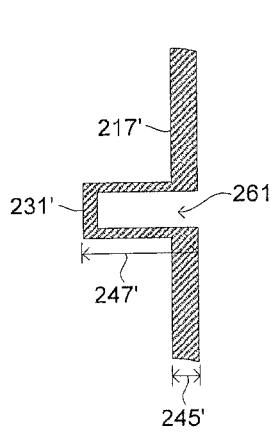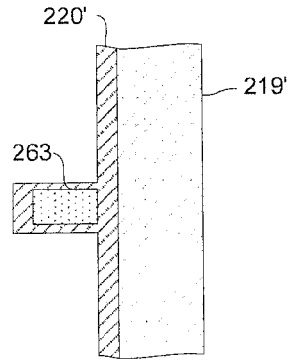
FIG. 7  FIG. 8A  FIG. 8B
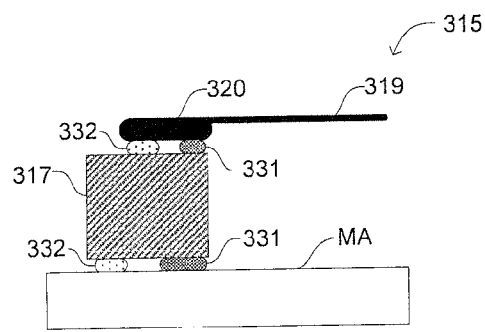
FIG. 9

MASK ASSEMBLY

FIELD

The present invention relates to a mask assembly. The present invention has particular, but not exclusive, use within an EUV lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g., a mask) onto a layer of radiation-sensitive material (resist) provided on a substrate.

The wavelength of radiation used by a lithographic apparatus to project a pattern onto a substrate determines the minimum size of features that can be formed on that substrate. A lithographic apparatus that uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A patterning device (e.g., a mask) that is used to impart a pattern to a radiation beam in a lithographic apparatus may form part of a mask assembly. A mask assembly may include a pellicle that protects the patterning device from particle contamination. The pellicle may be supported by a pellicle frame.

It is an object of the present invention to provide a mask assembly that obviates or mitigates one or more problems associated with known mask assemblies.

SUMMARY

According to a first aspect of the invention there is provided a mask assembly suitable for use in a lithographic process, the mask assembly comprising a patterning device; and a pellicle frame configured to support a pellicle and mounted on the patterning device with a mount; wherein the mount is configured to suspend the pellicle frame relative to the patterning device such that there is a gap between the pellicle frame and the patterning device; and wherein the mount provides a releasably engageable attachment between the patterning device and the pellicle frame.

This aspect of the invention is advantageous because it allows the pellicle frame to be removed from the patterning device and subsequently replaced, for example to allow for cleaning of the patterning device. Furthermore, because there is a gap between the pellicle frame and the patterning device the pellicle frame does not rub against the patterning device when it is being attached to the patterning device. This reduces the extent to which contamination particles may be generated when attaching the pellicle frame to the patterning device.

The mount may provide a kinematic connection between the pellicle frame and the patterning device.

The mount may comprise a plurality of sub-mounts.

Each sub-mount may be a kinematic sub-mount.

Each sub-mount may include a resilient component configured to allow movement of a section of the pellicle frame relative to the patterning device at that sub-mount.

Each sub-mount may be configured to restrain the movement of the pellicle frame at that sub-mount relative to the patterning device to a limited number of degrees of freedom such that movement in one direction is prevented at that sub-mount.

Each sub-mount may comprise a protrusion attached to one of the patterning device or the pellicle frame and an engagement mechanism attached to the other of the patterning device or the pellicle frame, the engagement mechanism being configured to receive and engage with the protrusion.

The engagement mechanism may comprise one or more resilient members configured to allow some movement of the engagement mechanism relative to the protrusion.

The engagement mechanism may comprise a locking member which is connected to the pellicle frame or the patterning device by one or more arms.

The one or more arms may extend generally parallel to a plane of the pellicle frame or the patterning device.

The one or more arms of a first engagement mechanism may extend generally parallel to an edge of the pellicle frame or the patterning device, and the one or more arms of a second engagement mechanism may extend generally perpendicular to an edge of the pellicle frame or the patterning device.

The locking member may be connected to the pellicle frame or the patterning device by two arms.

The protrusion may comprise a distal head provided on a shaft, and the locking member may be configured to engage with the shaft below the distal head.

The locking member may be resiliently deformable to allow it to pass over the distal head and engage with the shaft of the protrusion.

The locking member may comprise a locking plate mounted on a support, the locking plate being moveable to a position in which a recess in the locking plate engages with the shaft below the distal head.

The engagement mechanism may further comprise a movement limiting component which prevents the pellicle frame from contacting the patterning device.

The engagement mechanism may further comprise a movement limiting component which maintains the gap between the pellicle frame and the patterning device.

The movement limiting component may comprise a cap configured to engage with a distal surface of the protrusion.

The mount may comprise three or more sub-mounts.

The mount may comprise four sub-mounts.

Two sub-mounts may be provided on one side of the mask assembly and two sub-mounts may be provided on an opposite side of the mask assembly.

Each side of the pellicle frame may be provided with a sub-mount which allows movement in a first direction and a sub-mount which allows movement in a second direction which is substantially perpendicular to the first direction.

The sub-mounts may be provided as complementary pairs at equivalent positions on opposite sides of the pellicle frame.

The gap between the pellicle frame and the patterning device may be at least 100 microns.

The gap between the pellicle frame and the patterning device may be less than 300 microns.

The gap between the pellicle frame and the patterning device may be between 200 microns and 300 microns.

The gap between the pellicle frame and the patterning device may be smaller in the vicinity of a sub-mount than at other locations.

The gap in the vicinity of the sub-mount may be less than 200 microns.

The gap in the vicinity of the sub-mount may be around 100 microns or less.

According to a second aspect of the invention there is provided a mask assembly suitable for use in a lithographic process, the mask assembly comprising a patterning device and a pellicle frame which supports a pellicle, the pellicle frame being mounted on the patterning device, wherein the pellicle frame is provided with a capping layer.

The capping layer provided on the pellicle frame may be formed from the same material as a capping layer provided on the pellicle.

According to a third aspect of the invention there is provided a mask assembly suitable for use in a lithographic process, the mask assembly comprising a patterning device and a pellicle frame which supports a pellicle, the pellicle frame being mounted on the patterning device, wherein the pellicle frame and the pellicle are formed from the same material or from different materials which have the same coefficient of thermal expansion.

Making the pellicle frame and the pellicle from the same material or from different materials which have the same coefficient of thermal expansion is advantageous because it avoids bending which might occur if the pellicle frame and pellicle were to expand at different rates when heated (i.e. avoids the type of bending seen in a bimetallic strip).

According to a fourth aspect of the invention there is provided a mask assembly suitable for use in a lithographic process, the mask assembly comprising a patterning device, a sub-frame secured to the patterning device, a pellicle frame configured to support a pellicle and a mechanical attachment interface operable to allow attachment of the pellicle frame to the sub-frame and detachment of the pellicle frame from the sub-frame.

The mechanical attachment interface allows the pellicle frame to be conveniently attached and detached from the patterning device without the need to glue the pellicle frame to the patterning device. This allows for convenient replacement of a pellicle by replacing the pellicle frame, which is attached to a patterning device. Being able to conveniently attach and detach the pellicle frame from the patterning device may allow additional areas of the patterning device to be used for the pellicle frame since access to these areas may be provided by detaching the pellicle frame from the patterning device. Allowing additional areas of the patterning device to be used for the pellicle frame may allow the dimensions of the pellicle frame to be increased thereby increasing the strength of the pellicle frame.

The patterning device may include a cut-away portion in a front side of the patterning device in which the extent of the front side is reduced relative to a backside of the patterning device, the cut-away portion being configured to receive a portion of the pellicle frame.

The cut-away portion may allow the extent of the pellicle frame to be increased thereby increasing the strength of the pellicle frame. The cut-away portion may provide for accurate positioning of the pellicle frame on the patterning device since the cut-away portion restrains the position of the pellicle frame relative to the patterning device.

The cut-away portion may be positioned adjacent to an outer extent of the front side of the patterning device.

The sub-frame may be positioned adjacent to the cut-away portion.

The sub-frame may be bonded to the patterning device.

The sub-frame may comprise a recess in which a glue is disposed such that the glue is positioned in a volume that is enclosed by the recess and the patterning device.

Disposing the glue within an enclosed volume constrains any products of outgassing from the glue so as to prevent the products of outgassing from contaminating the patterning device.

According to a fifth aspect of the invention there is provided a mask assembly suitable for use in a lithographic process, the mask assembly comprising, a patterning device and a pellicle frame configured to support a pellicle and mounted on the patterning device with a mount, wherein the mount includes a flexible component configured to allow movement of at least one section of the pellicle frame relative to the patterning device.

The inclusion of a flexible component configured to allow movement of a section of the pellicle frame relative to the patterning device reduces any stress that is placed on the patterning device. For example, during use the patterning device and/or the pellicle frame may expand and contract (e.g., due to heating and cooling of the patterning device and/or the pellicle frame). Expansion and contraction of the patterning device and/or the pellicle frame may induce stress around points at which the pellicle frame and the patterning device are attached to each other. Allowing movement of sections of the pellicle frame relative to the patterning device reduces the induced stress.

The mount may be configured to restrain the movement of the pellicle frame so as to prevent the pellicle frame as a whole from undergoing rotation or translation relative to the patterning device.

The mount may comprise a plurality of sub-mounts, each sub-mount providing an attachment between the patterning device and the pellicle frame at a different position and each sub-mount including a flexible component configured to allow movement of a section of the pellicle frame relative to the patterning device at that position.

Each sub-mount may be configured to restrain the movement of the pellicle frame at that sub-mount relative to the patterning device to a limited number of degrees of freedom such that movement in one direction is prevented at that sub-mount.

The mount may comprise three sub-mounts.

The flexible component may comprise an elastic element.

According to a sixth aspect of the invention there is provided a mask assembly suitable for use in a lithographic process, the mask assembly comprising a patterning device and a pellicle frame configured to support a pellicle and attached to the patterning device with a mount so as to enclose a region of the patterning device, wherein the pellicle frame includes extended portions and non-extended portions, wherein the extended portions of the pellicle frame have a width that is greater than the width of the non-extended portions of the pellicle frame.

The extended portions provide additional surface area at which a pellicle may be attached to the pellicle frame. This may allow the extent of a border portion of the pellicle (which has an increased thickness relative to the rest of the pellicle) to be increased. A pellicle having a border portion with an increased extent may allow for convenient handling of the pellicle by gripping the border portion.

The one or more holes may be provided in the extended portions and may be configured to allow gas to flow through the pellicle frame.

The increased width of the extended portions may mean that the extended portions have an increased strength relative to the rest of the pellicle frame. This may make the extended portions suitable for supporting holes in order to allow for a gas flow through the pellicle frame without significantly comprising the strength of the pellicle frame.

At least one of the extended portions may be provided with an alignment mark.

The extended portions may include a hollowed portion.

The mask assembly may further comprise a pellicle that may be supported by the pellicle frame. The pellicle may include a border portion having a thickness that is greater than the rest of the pellicle.

The border portion of the pellicle may include extended portions that correspond with the extended portions of the pellicle frame.

The extended portions of the pellicle may include pores through which gas may flow, the pores being aligned with the hollowed portion of the pellicle frame so as to allow gas to flow through the pores and into and out of a volume between the pellicle and the patterning device. The extended portions may be provided with an alignment mark.

Allowing gas flow through pores in the pellicle may reduce or eliminate the need for holes or filters in the pellicle frame, thereby increasing the strength of the pellicle frame.

The mask assembly may be configured so as to provide a gap between the pellicle frame and the patterning device, the gap being configured such that, in use, gas is allowed to flow through the gap and into and out of a volume between a pellicle supported by the pellicle frame and the patterning device.

Providing a gap between the pellicle frame and the patterning device allows for pressure equalization across the pellicle without providing holes or filters in the pellicle frame.

The pellicle frame may include a window in the body of the frame, the window being configured to allow transmission of one or more radiation beams.

The window may allow access to alignment marks or identification marks on the patterning device when the pellicle frame is fitted to the patterning device.

The window may be configured to prevent particles from passing through the window.

The pellicle frame may include a hole which extends through the pellicle frame but which does not provide a direct line of sight through the pellicle frame to the patterning device.

The hole that extends through the pellicle frame may not provide a direct unobstructed path through the pellicle frame.

The mask assembly may be configured such that the pellicle frame surrounds substantially the whole of a front side of the patterning device.

The pellicle frame may be attached to the patterning device by optical contact bonding.

Attachment by optical contact bonding may reduce or eliminate the need to use glue in order to attach the pellicle frame to the patterning device. This advantageously reduces the presence of products of outgassing from a glue.

The mask assembly may further comprise a pellicle supported by the pellicle frame, wherein an electrically conductive path is provided between the patterning device and the pellicle.

An electrically conductive material may be provided between the patterning device and the pellicle frame and an electrically conductive material may be provided between the pellicle frame the pellicle.

According to a seventh aspect of the invention there is provided a patterning device suitable for use in a lithographic process, the patterning device comprising a front side imparted with a pattern and a back side suitable for securing to a support structure, wherein the front side includes a cut-away portion in which the extent of the front side is reduced relative to the backside, the cut-away portion being configured to receive a portion of a pellicle frame.

The patterning device may further comprise a sub-frame secured to the patterning device, the sub-frame including a mechanical attachment interface operable to selectively attach a pellicle frame to the sub-frame.

According to an eighth aspect of the invention there is provided a lithographic apparatus comprising an illumination system configured to condition a radiation beam, a support structure supporting a mask assembly according to any preceding claim, the mask assembly being configured to impart the radiation beam with a pattern in its cross-section to form a patterned radiation beam, a substrate table constructed to hold a substrate and a projection system configured to project the patterned radiation beam onto the substrate.

According to a ninth aspect of the invention there is provided a pellicle assembly for use in a lithographic apparatus, the pellicle assembly comprising a pellicle frame suitable for attachment to a patterning device and a pellicle supported by the pellicle frame, the pellicle comprising a thin film portion extending across the pellicle frame so as to define a plane and a border portion attached to the pellicle frame and having a thickness which is greater than the thickness of the thin film portion wherein at least some of the border portion extends out of the plane defined by the thin film portion and away from the pellicle frame.

The thickness of the border portion which extends out of the plane defined by the thin film portion and away from the pellicle frame may be greater than a thickness of the border portion which extends out of the plane defined by the thin film portion and towards the pellicle frame.

The border portion may have a first surface at which the border portion is attached to the pellicle frame and the first surface may be substantially coplanar with the plane defined by the thin film portion.

According to a tenth aspect of the invention there is provided a pellicle frame suitable for attachment to a patterning device and for supporting a pellicle adjacent the patterning device, the patterning device having a patterned area and being suitable for use in a lithographic process and the pellicle frame comprising a recess configured to receive a glue for attachment of a pellicle or a patterning device to the pellicle frame, wherein the recess is configured such that, in use, attachment of a pellicle or a patterning device to the pellicle frame causes the glue to be sealed from the patterned area of the patterning device so as to prevent products of outgassing from the glue from reaching the patterned area of the patterning device.

The recess may be configured such that, in use, attachment of a pellicle or a patterning device to the pellicle frame causes the glue to be contained within a volume enclosed by the recess and the pellicle or patterning device.

The pellicle frame may comprise a plurality of recesses, wherein at least one of the plurality of recesses is configured to receive a glue for attachment of a pellicle to the pellicle frame and wherein at least one of the recesses is configured to receive a glue for attachment of a patterning device to the pellicle frame.

A plurality of recesses may be distributed around the pellicle frame, each recess extending from an outer edge of the pellicle frame partway to an inner edge of the pellicle frame and back to the outer edge of the pellicle frame.

According to an eleventh aspect there is provided a pellicle assembly comprising a pellicle frame according to the seventh aspect and a pellicle attached to the pellicle frame with a glue disposed in a recess in the pellicle frame.

According to a twelfth aspect of the invention there is provided a lithographic system comprising a pellicle frame attachment apparatus configured to receive a patterning device, a pellicle frame and a pellicle and attach the pellicle frame to the patterning device so as to form a mask assembly in which the pellicle frame supports the pellicle adjacent the patterning device, a lithographic apparatus comprising a support structure configured to receive the mask assembly from the pellicle frame attachment apparatus and support the mask assembly, an illumination system configured to condition a radiation beam and illuminate the mask assembly with the conditioned radiation beam, the patterning device of the mask assembly being configured to impart the conditioned radiation beam with a pattern in its cross-section to form a patterned radiation beam, a substrate table constructed to hold a substrate and a projection system configured to project the patterned radiation beam onto the substrate, the lithographic system further comprising a mask assembly transport device configured to transport the mask assembly from the pellicle frame attachment apparatus to the lithographic apparatus for use in the lithographic apparatus.

The pellicle frame attachment apparatus may be configured to attach the pellicle frame to the patterning device in a sealed environment.

The pellicle frame attachment apparatus may comprise a vacuum pump configured to pump the sealed environment of the pellicle frame attachment apparatus to vacuum pressure conditions.

The mask assembly transport device may be configured to transport the mask assembly from the pellicle frame attachment apparatus to the lithographic apparatus in a sealed environment.

The mask assembly transport device may comprise a vacuum pump configured to pump the sealed environment of the mask assembly attachment apparatus to vacuum pressure conditions.

The lithographic system may further comprise an inspection apparatus configured to inspect one or more of the pellicle, pellicle frame and patterning device for at least one of contamination or defects.

The pellicle frame attachment apparatus may be configured to receive a pellicle attached to a pellicle frame and attach the pellicle frame with the pellicle attached to a patterning device.

The illumination system may be configured to condition an EUV radiation beam.

The pellicle frame attachment apparatus may be configured to receive a pellicle which is substantially transparent to EUV radiation.

According to a thirteenth aspect of the invention there is provided a pellicle attachment apparatus configured to receive a pellicle and a pellicle frame, attach the pellicle to the pellicle frame to form a pellicle assembly and seal the pellicle assembly in a sealed packaging suitable for transportation of the pellicle assembly within the sealed packaging.

The pellicle attachment apparatus may be configured to attach the pellicle to the pellicle frame in a sealed environment.

The pellicle attachment apparatus may further comprise a vacuum pump configured to pump the sealed environment to vacuum pressure conditions.

The pellicle attachment apparatus may further comprise an inspection apparatus configured to inspect one or both of the pellicle and pellicle frame for at least one of contamination or defects.

It will be appreciated that one or more aspects or features described in the preceding or following descriptions may be combined with one or more other aspects or features.

BRIEF DESCRIPTION OF THE DRAWINGS

Embodiments of the invention will now be described, by way of example only, with reference to the accompanying schematic drawings, in which:

FIG. 7 is a schematic illustration of a portion of the mask assembly of FIG. 6;

FIGS. 8A and 8B are schematic illustrations of a portion of a pellicle frame and a pellicle according to an embodiment of the invention;

FIG. 9 is a schematic illustration of a portion of a mask assembly according to embodiments of the invention;

DETAILED DESCRIPTION

Figure 1:
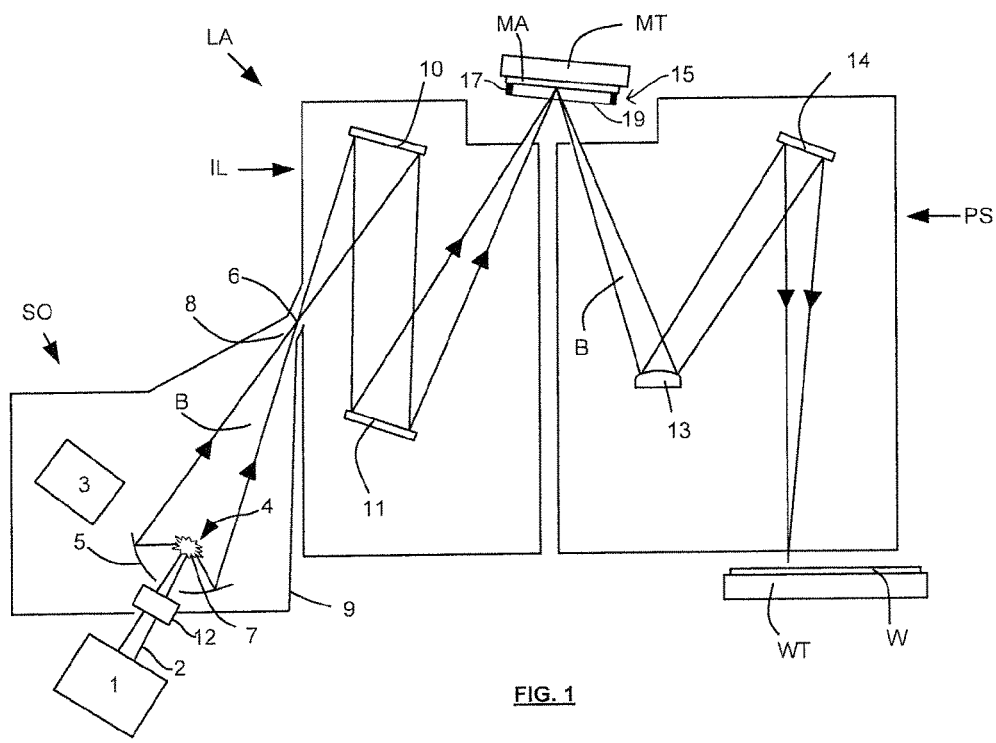
FIG. 1 is a schematic illustration of a lithographic system comprising a lithographic apparatus and a radiation source.

FIG. 1 shows a lithographic system including a mask assembly according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a mask assembly 15 including a patterning device MA (e.g., a mask), a projection system PS and a substrate table WT configured to support a substrate W. The illumination system IL is configured to condition the radiation beam B before it is incident upon the patterning device MA. The projection system is configured to project the radiation beam B (now patterned by the patterning device MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g., hydrogen) may be provided in the radiation source SO. A vacuum may be provided in the illumination system IL and/or the projection system PS. A small amount of gas (e.g., hydrogen) at a pressure well below atmospheric pressure may be provided in the illumination system IL and/or the projection system PS.

The radiation source SO shown in FIG. 1 is of a type that may be referred to as a laser produced plasma (LPP) source. A laser 1, which may for example be a $CO_2$ laser, is arranged to deposit energy via a laser beam 2 into a fuel, such as tin (Sn) that is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g., in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure that is arranged to reflect EUV radiation (e.g., EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments of a laser produced plasma (LPP) source the collector 5 may be a so-called grazing incidence collector that is configured to receive EUV radiation at grazing incidence angles and focus the EUV radiation at an intermediate focus. A grazing incidence collector may, for example, be a nested collector, comprising a plurality of grazing incidence reflectors. The grazing incidence reflectors may be disposed axially symmetrically around an optical axis O.

The radiation source SO may include one or more contamination traps (not shown). For example, a contamination trap may be located between the plasma formation region 4 and the radiation collector 5. The contamination trap may for example be a rotating foil trap, or may be any other suitable form of contamination trap.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the mask assembly 15 held by the support structure MT. The mask assembly 15 includes a patterning device MA and a pellicle 19, which is held in place by a pellicle frame 17. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors that are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g., six mirrors).

The lithographic apparatus may, for example, be used in a scan mode, wherein the support structure (e.g., mask table) MT and the substrate table WT are scanned synchronously while a pattern imparted to the radiation beam is projected onto a substrate W (i.e., a dynamic exposure). The velocity and direction of the substrate table WT relative to the support structure (e.g., mask table) MT may be determined by the demagnification and image reversal characteristics of the projection system PS. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

The radiation source SO and/or the lithographic apparatus that is shown in FIG. 1 may include components that are not illustrated. For example, a spectral filter may be provided in the radiation source SO. The spectral filter may be substantially transmissive for EUV radiation but substantially blocking for other wavelengths of radiation such as infrared radiation.

In other embodiments of a lithographic system the radiation source SO may take other forms. For example, in alternative embodiments the radiation source SO may comprise one or more free electron lasers. The one or more free electron lasers may be configured to emit EUV radiation that may be provided to one or more lithographic apparatus.

As was described briefly above, the mask assembly 15 includes a pellicle 19 that is provided adjacent to the patterning device MA. The pellicle 19 is provided in the path of the radiation beam B such that radiation beam B passes through the pellicle 19 both as it approaches the patterning device MA from the illumination system IL and as it is reflected by the patterning device MA towards the projection system PS. The pellicle 19 comprises a thin film that is substantially transparent to EUV radiation (although it will absorb a small amount of EUV radiation). By EUV transparent pellicle or a film substantially transparent for EUV radiation herein is meant that the pellicle 19 is transmissive for at least 65% of the EUV radiation, preferably at least 80% and more preferably at least 90% of the EUV radiation. The pellicle 19 acts to protect the patterning device MA from particle contamination.

Whilst efforts may be made to maintain a clean environment inside the lithographic apparatus LA, particles may still be present inside the lithographic apparatus LA. In the absence of a pellicle 19, particles may be deposited onto the patterning device MA. Particles on the patterning device MA may disadvantageously affect the pattern that is imparted to the radiation beam B and the pattern that is transferred to the substrate W. The pellicle 19 advantageously provides a barrier between the patterning device MA and the environment in the lithographic apparatus LA in order to prevent particles from being deposited on the patterning device MA.

The pellicle 19 is positioned at a distance from the patterning device MA that is sufficient that any particles that are incident upon the surface of the pellicle 19 are not in the focal plane of the radiation beam B. This separation between the pellicle 19 and the patterning device MA, acts to reduce the extent to which any particles on the surface of the pellicle 19 impart a pattern to the radiation beam B. It will be appreciated that where a particle is present in the beam of radiation B, but at a position that is not in a focal plane of the beam of radiation B (i.e., not at the surface of the patterning device MA), then any image of the particle will not be in focus at the surface of the substrate W. In some embodiments, the separation between the pellicle 19 and the patterning device MA may, for example, be approximately between 1 mm and 10 mm, for example between 1 mm and 5 mm, more preferably between 2 mm and 2.5 mm.

Figure 2A:
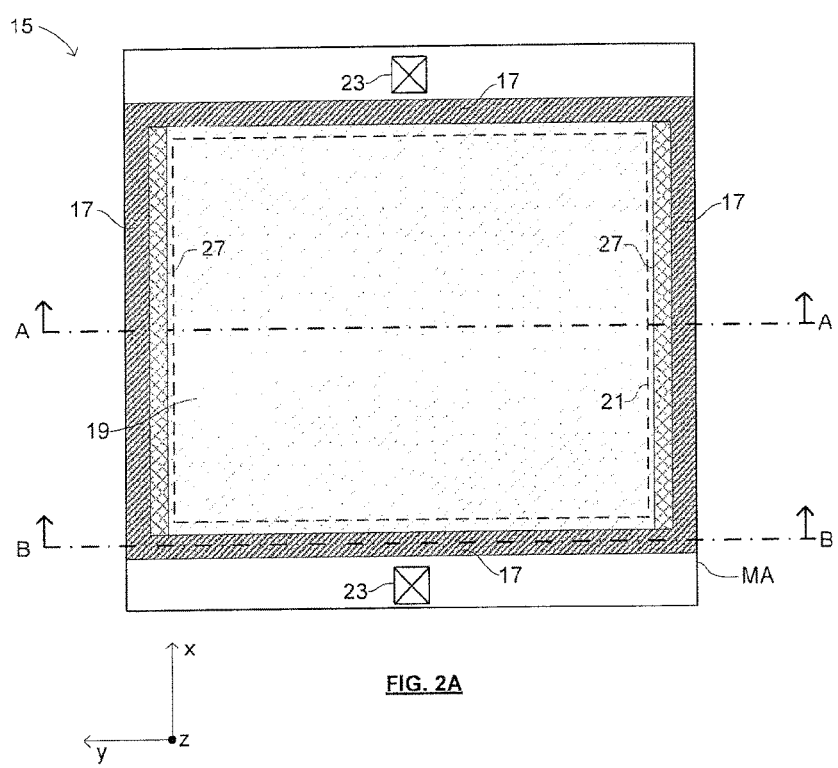
FIGS. 2A, 2B and 2C are schematic illustrations of a mask assembly according to an embodiment of the invention.
Figure 2B:
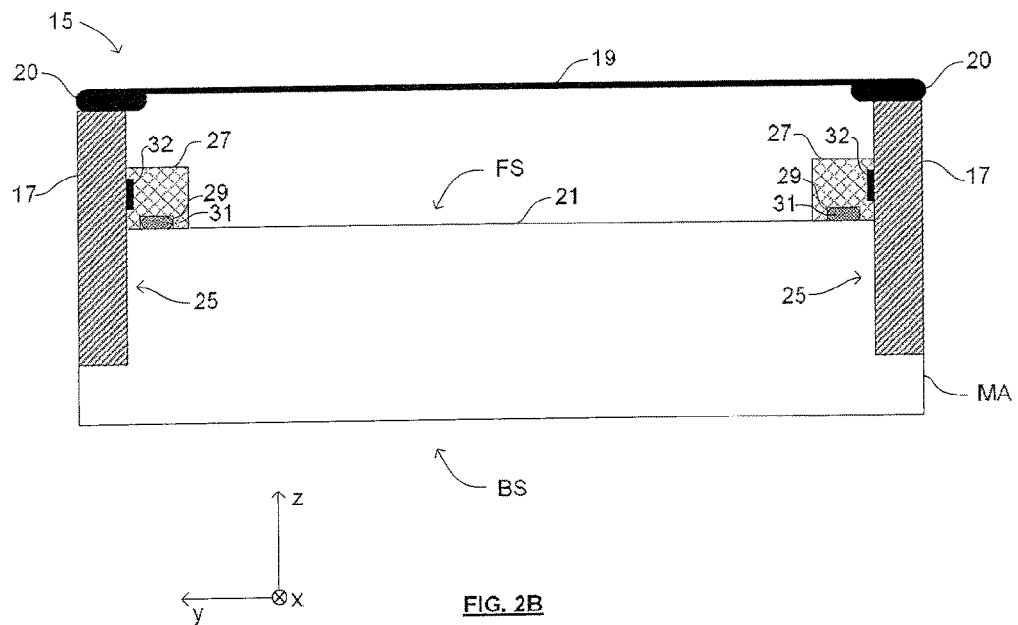
Figure 2C:
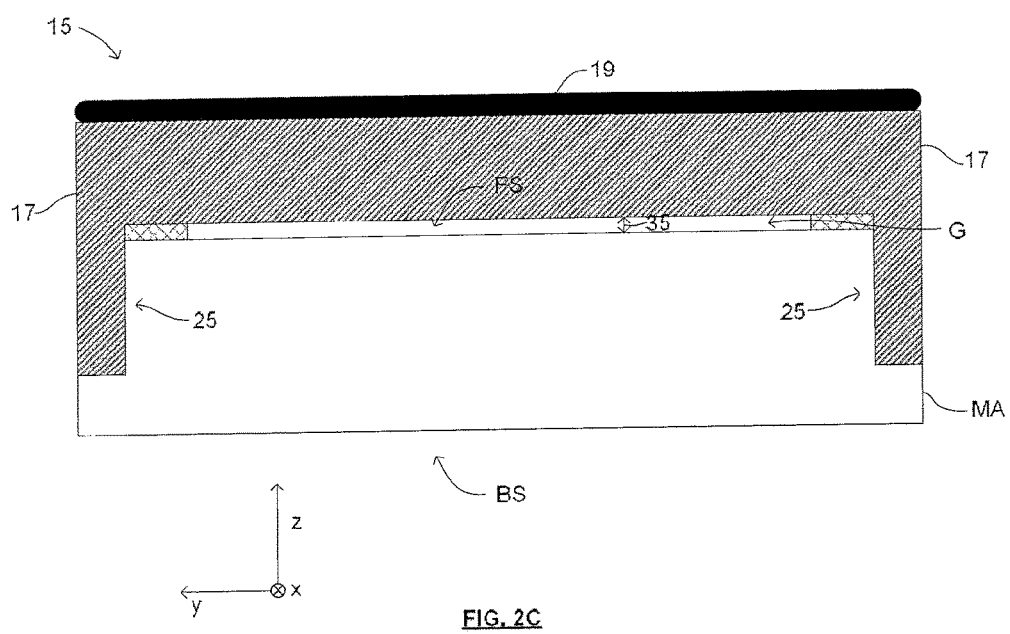

FIGS. 2A, 2B and 2C are schematic illustrations of a mask assembly 15 according to an embodiment of the invention. FIG. 2A shows a plan view of the mask assembly 15. FIG. 2B shows a cross-section of the mask assembly 15 along the line A-A, which is shown in FIG. 2A. FIG. 2C shows a cross-section of the mask assembly 15 along the line B-B, which is shown in FIG. 2A. A consistent Cartesian co-ordinate system is used throughout FIGS. 2A, 2B and 2C in which the y-direction denotes a scanning direction of the patterning device MA relative to a radiation beam B.

The mask assembly 15 comprises a patterning device MA, a pellicle frame 17 and a pellicle 19. The pellicle 19 comprises a thin film that is substantially transparent to EUV radiation. The pellicle 19 may be formed from any material that is substantially transparent to EUV radiation while providing a barrier to particle contamination.

For example, the pellicle 19 may be formed from a polysilicon (pSi) film. One or both of the sides of the pellicle 19 (e.g. polysilicon film) may be capped with a capping layer such as a metal layer (e.g. Ru layer) for an improved thermal emissivity. In an alternative example the pellicle 19 may be formed from a multi-layer stack of molybdenum (Mo) and zirconium silicide (ZrSi). The Mo/ZrSi stack may be capped on one or both sides with a capping layer. Other materials, for example graphene, silicene, silicon nitride, fullerene, carbon nanotubes, diamond-like carbon (DLC) or other materials substantially transparent to EUV radiation may be suitable for use as a pellicle 19 in other embodiments.

The capping layer may be a refractory material selected from a group consisting of: the elements Nb, Zr, Y, La, Ce, alloys of Mo, Nb, Ru, Zr, Y, La, Ce, silicides of Mo, Nb, Ru, Zr, Y, La and Ce, silicides of such alloys, oxides of Mo, Nb, Ru, Zr, La, Ce, oxides of alloys of Mo, Nb, Ru, Zr, Y, La, Ce, carbides of Mo, Nb, Ru, Zr, Y, La, Ce, carbides of such alloys, nitrides of Mo, Nb, Ru, Zr, La, Ce and nitrides of alloys of No, Nb, Ru, Zr, La, Y, Ce.

The capping layers referred to above may help to reduce the effect of hydrogen radicals (or other reactive species), which may be generated from hydrogen gas in the presence of EUV radiation, and which may cause damage to the pellicle 19.

A capping layer may also be provided on the pellicle frame 17 (or other embodiments of pellicle frames). The capping layer may be formed from the same material as the capping layer provided on the pellicle 19.

The thickness of the pellicle film 19 will depend on the material properties (e.g., strength, EUV transparency). Preferably the thickness of the pellicle 19 is in a range from 5 to 100 nm. For example, a pellicle film made from a Mo/ZrSi multilayer stack may be approximately 25 nm thick. Alternatively, a pellicle made from polysilicon may be approximately 40 nm thick. A graphene pellicle may be, for example, approximately 10 nm thick.

The transmission by a pellicle of EUV radiation depends on the thickness of the pellicle and the purity of the materials from which the pellicle and the capping layer are formed. The pellicle may be sufficiently thin to allow for a given transmission of EUV radiation. For example, the pellicle may be sufficiently thin such that it transmits more than approximately 65% of EUV radiation that is incident on it. It may be desirable for the pellicle to be sufficiently thin such that it transmits at least approximately 85% of EUV radiation or at least approximately 90% of EUV radiation that incident on it.

The patterning device MA comprises a patterned area 21. The patterned area 21 is provided with a pattern to be transferred to a substrate W by reflection of radiation (e.g., EUV radiation) from the patterned area 21. The patterned area 21 is disposed on a front side FS of the patterning device MA. An opposing back side BS of the patterning device MA may be secured (e.g., clamped) to a support structure MT. For example the back side BS of the patterning device may be clamped to the support structure MT using an electrostatic clamp.

The pellicle frame 17 includes a rectangular opening at its center such that the pellicle frame 17 extends around and surrounds the patterned area 21. Whilst in the embodiment of FIGS. 2A-C the opening that is provided by the pellicle frame 17 is rectangular, in other embodiments the opening that is provided by the pellicle frame may have any suitable shape. The pellicle 19 is attached to the pellicle frame 17 such that it is suspended across the patterned area 21 of the patterning device MA. The pellicle 19 includes a border portion 20, which has an increased thickness compared to the rest of the pellicle 19. For example, the border portion 20 may have a thickness of approximately 60 nm. The border portion 20 serves to increase the strength of the pellicle 19 in the region at which the pellicle is attached to the pellicle frame 17. The border portion 20 may additionally provide a portion of the pellicle 19 that may be gripped during handling of the pellicle 19. For example, when applying or removing a pellicle 19 from a pellicle frame 17 the border portion 20 may be gripped in order to manipulate the pellicle 19. The increased thickness of the border portion 20 advantageously increases the resistance of the border portion 20 to damage and/or breakage when being gripped. The border portion may be formed from the same or different materials to the rest of the pellicle. In embodiments in which the film of the pellicle is formed from polysilicon the border portion may also be formed from polysilicon.

Whilst the pattern that is to be transferred to a substrate W is contained within the patterned area 21, the patterning device MA may include other patterned regions or markings outside of the patterned area 21. For example, the patterning device MA may include alignment marks 23 that may be used to align the patterning device MA. The patterning device may additionally or alternatively include one or more identification marks (e.g., one or more bar codes), which may be used to identify the patterning device MA.

In the embodiment that is shown in FIGS. 2A, 2B and 2C the patterning device MA includes cut-away portions 25 (best seen in FIGS. 2B and 2C) in which the extent of the front side FS of the patterning device MA is reduced relative to the backside BS of the patterning device MA. The cut-away portions 25 are configured to receive a portion of the pellicle frame 17 as is shown in FIG. 2B. The cut-away portions are positioned adjacent to an outer extent of the front side FS of the patterning device MA. However, in other embodiments the pellicle frame 17 may be attached to the front or the side of the patterning device MA without having cut-away portions. In an embodiment the pellicle frame may be attached at the two sides of the patterning device MA which are parallel to the scanning direction. In another embodiment the pellicle frame may be attached at the two sides of the patterning device MA which are perpendicular to the scanning direction. In yet another embodiment combinations of front and side attachments as described above are also envisaged.

In order to provide an interface by which the pellicle frame 17 may be attached to the patterning device MA, the patterning device may be provided with sub-frames 27, which extend along the two sides of the patterned area 21 that are parallel with the x-axis (and are therefore perpendicular to the scanning direction). The sub-frames 27 are positioned adjacent to the cut-away portions 25. Each sub-frame 27 includes a recess 29 that is enclosed by the sub-frame 27 and the patterning device MA such that the recess defines a closed volume. In order to secure the sub-frame 27 to the patterning device MA glue 31 (which may also be referred to as adhesive) is disposed in the recess 29. When first applied in the recess 29 the glue may undergo a curing process in which the glue shrinks. Shrinkage of the glue may pull the sub-frame 27 towards the patterning device MA so as to secure the sub-frame 27 to the patterning device MA. The sub-frame 27 may also include two or more recesses 29. The pellicle border portion 20 may include recesses to attach the pellicle to the pellicle frame 17. Recesses may also be provided in the patterning device MA or in pellicle frame components in order to enclose the glue 31.

By positioning the glue 31 within the closed volume that is defined by the recess 29 and the patterning device MA, the glue 31 is sealed from the surrounding environment. Sealing the glue from the surrounding environment is advantageous since gas may be released from the glue by outgassing. The products of outgassing from a glue can disadvantageously contaminate the environment in which the patterning device MA is held. Sealing the glue from the surrounding environment (in the recess 29) ensures that the products of outgassing from the glue are contained within the recess 29 and therefore advantageously prevents contamination of the environment in which the patterning device MA is held by outgassing from the glue 31.

In particular, it is advantageous to seal the glue so as to prevent the products of outgassing from the glue 31 from reaching the patterned area 21 of the patterning device MA. In the event that products of outgassing from the glue reach the patterned area 21, the pattern that is transferred to the radiation beam B and thus the pattern that is transferred to a substrate W may be adversely affected. It is therefore desirable to seal the glue 31 so as to prevent the products of outgassing from the glue 31 from reaching the patterned area 21 in order to preserve the quality of the pattern that is transferred to a substrate W.

In some embodiments the sub-frames 27 may be configured so as to allow a limited amount of the products from outgassing of the glue 31 to be leaked from the recesses 29 in a direction such that the products travel away from the patterned area 21. For example, the sub-frames 27 may be configured such that products may leak towards the outside of the sub-frames 27 whilst still preventing the products from reaching the patterned area 21 of the patterning device MA.

The patterning device MA may be periodically cleaned. For example, cleaning fluids may be applied to the patterning device MA in order to clean the patterning device MA. When cleaning a patterning device MA using cleaning fluids it is desirable to prevent the cleaning fluids from coming into contact with any glue that is used to secure elements of the mask assembly 15 together. In the event that cleaning fluids were to come into contact with glue then the glue may be dissolved by the cleaning fluids. Glue that is dissolved by the cleaning fluids may be spread over components of a mask assembly 15 during a cleaning process. For example, glue may be brought into contact with the patterned area 21 of the patterning device MA. Glue that comes into contact with the patterned area 21 of the patterning device MA may adversely affect the pattern that is transferred to the radiation beam B and thus the pattern that is transferred to a substrate W. In known mask assemblies in which glue is not positioned in a sealed volume any residual glue must first be removed from the mask assembly before the patterning device can be cleaned using cleaning fluids. By sealing the glue 31 in sealed recesses 29 as is shown in FIG. 2B, the patterning device MA can be cleaned with the sub-frames 27 still attached to the patterning device MA with the glue 31 without risking contact between cleaning fluids and glue.

The sub-frames 27 include attachment interfaces 32, which are operable to selectively attach and detach the pellicle frame 17 to and from the sub-frames 27. The attachment interfaces 32 are therefore used to secure the pellicle frame 17 to the patterning device MA. The attachment interfaces 32 provide a means for mechanically attaching and detaching the pellicle frame 17 to and from the patterning device MA without requiring the use of a glue. The pellicle frame 17 may include components that couple with the attachment interfaces 32 so as to secure the pellicle frame 17 to the sub-frames 27. The attachment interfaces 32 may take any suitable form. For example, the attachment interfaces 32 may comprise openings configured to receive one or more fasteners (e.g., screws) suitable for fastening the pellicle frame 17 to the sub-frames 27. In some embodiments, the attachment interfaces 32 may include magnetic components that exert a magnetic force on the pellicle frame 17 so as to secure the pellicle frame 17 to the sub-frames 27. In some embodiments, the attachment interfaces 32 may include a surface that is configured to exert a frictional force on the pellicle frame 17 so as to resist relative movement of the pellicle frame 17 and the sub-frames 27. The elimination of the need for the use of glue in order to attach the pellicle frame to the patterning device MA (via the sub-frames 27) advantageously reduces the risk of contamination of the environment in which the patterning device is held through outgassing from a glue.

As was explained above, the attachment interfaces 32 on the sub-frames 27 may provide for fast and convenient attachment and a clean detachment (substantially no particles induced by removal) of the pellicle frame 17 (and the pellicle 19) from the patterning device MA without the need to glue the pellicle frame 17 to the patterning device MA. A pellicle 19 may have a shorter lifetime than a patterning device MA and as such the pellicle 19 of a mask assembly 15 may be periodically replaced. For example, a pellicle 19 may be replaced approximately every two weeks. Known mask assemblies may include a pellicle frame that is permanently attached to a patterning device. A pellicle may be replaced in a mask assembly by gluing a new pellicle to the pellicle frame that is permanently attached to the patterning device MA. Replacing a pellicle in this manner (by periodically gluing a new pellicle to a pellicle frame) may increase the risk of contamination caused by outgassing from the glue.

The mask assembly 15 that is shown in FIG. 2A-2C advantageously allows for replacement of a pellicle by detaching a pellicle frame 17 (with a pellicle 19 attached) from the patterning device MA and attaching a new pellicle frame 17 and pellicle 19 to the patterning device MA without the use of glue. The potential for contamination by outgassing from glue is therefore advantageously reduced when compared to such known mask assemblies. An additional advantage of the easily replaceable pellicle frame 17 of FIGS. 2A-2C is that the pellicle frame 17 can be removed from the patterning device MA in order to allow for cleaning of the patterning device (e.g., using cleaning fluids) or for inspection. After removal of a pellicle frame 17 from the patterning device MA the only glue that is present on the patterning device is sealed within the recesses 29 of the sub-frames 27. The patterning device MA may therefore be cleaned with cleaning fluids whilst avoiding any contact between cleaning fluids and glue.

As can be seen from FIG. 2C, the sides of the pellicle frame 17 that extend parallel to the y-axis are not located in cut-away portions of the patterning device MA. Instead, a gap G is left between the pellicle frame 17 and the front side FS of the patterning device MA. In contrast to this pellicle frame design, most of the known masks with a pellicle have openings, slits or gaps in the pellicle frame controlled with filters or valves in order to reduce as much as possible the danger of contamination of the mask with particles. The pellicle frame 17 according to the embodiment has instead an open gap which extends partially or around the whole frame perimeter such that the pellicle frame 17 may be considered to be suspended. The gap U allows for air to flow into and out of the volume between the pellicle 19 and the front side FS of the patterning device MA. It has been determined that by controlling the gap size it is still possible to mitigate most of the particle contamination which can be circulated by the gas flow (even in the absence of a filter).

During use a mask assembly 15 may be subjected to large changes in pressure.

For example, a mask assembly 15 may be exposed to atmospheric pressure conditions outside of a lithographic apparatus before being loaded into a lithographic apparatus via a load lock, which is pumped to vacuum pressure conditions. The mask assembly 15 may experience vacuum pressure conditions whilst inside the lithographic apparatus before being unloaded from the lithographic apparatus via a load lock, which is vented to atmospheric pressure. The mask assembly 15 therefore experiences large increases and decreases in pressure.

Changes in the pressure conditions to which a mask assembly is exposed may cause a pressure difference to exist across the pellicle 19. For example, when the mask assembly 15 is in a load lock from which gas is evacuated, if gas is not evacuated from the volume between the pellicle 19 and the front side FS of the patterning device MA at the same rate as gas is evacuated from the outside of the mask assembly 15 then the pressure in the volume between the pellicle 19 and the front side FS of the patterning device MA may be greater than the pressure outside of the mask assembly 15. A pressure difference may therefore exist across the pellicle 19. The pellicle 19 is typically a thin flexible film that may be bent when exposed to pressure differences. For example, if the pressure in the volume between the pellicle 19 and the front side FS of the patterning device MA is greater than the pressure outside of the mask assembly 15 then the pellicle 19 may be bent away from the patterning device MA. Conversely if the pressure in the volume between the pellicle 19 and the front side FS of the patterning device MA is less than the pressure outside of the mask assembly 15 (e.g., during an increase in the pressure conditions to which the mask assembly 15 is exposed) then the pellicle 19 may be bent towards the patterning device MA.

Bending of the pellicle 19 may cause the pellicle 19 to come into contact with other components. For example, a pellicle 19 that is bent towards the patterning device may come into contact with the front side FS of the patterning device MA. A pellicle that is bent away from the patterning device MA may come into contact with other components of a lithographic apparatus. Excessive bending of a pellicle 19 and/or a pellicle coming into contact with another component may cause damage to the pellicle or surrounding components and may result in breakage of the pellicle 19. It is therefore desirable to limit any pressure differences that exists across a pellicle 19 in order avoid damage to the pellicle. The pressure difference may be kept below a pellicle breakup threshold value, which depends on the strength of the material used to form the pellicle. In some embodiments a small pressure difference may be desirable, for example in order to mitigate wrinkles in the pellicle.

The gap G between the pellicle frame 17 and the front side FS of the patterning device MA allows for gas to flow into and out of the volume between the pellicle 19 and the front side FS of the patterning device MA. Allowing a gas flow into and out of the volume between the pellicle 19 and the front side FS of the patterning device MA allows for pressure equalization either side of the pellicle 19 such that the pellicle 19 is not subjected to damaging pressure differences across the pellicle 19.

The size of the gap G between the pellicle frame 17 and the front side FS of the patterning device MA will affect the rate at which gas can flow into and out of the volume between the front side FS of the patterning device MA and the pellicle 19. The rate at which gas can flow into and out of the volume between the front side FS of the patterning device MA and the pellicle 19 may affect the size of any pressure differences across the pellicle 19. For example, increasing the size of the gap G will increase the rate at which gas can flow into and out of the volume between the front side FS of the patterning device MA and the pellicle 19.

An increase in the rate of gas flow may limit any pressure difference that exists across the pellicle 19.

Whilst it may be desirable to provide a large enough gap G to allow a sufficient rate of gas flow into and out of the volume between the pellicle 19 and the front side FS of the patterning device MA in order to limit any pressure difference that exists across the pellicle 19 it is also desirable to prevent particles from passing through the gap G. Particles that pass through the gap G may be deposited on the patterning device MA. As was described above particles that are deposited on the patterning device MA may disadvantageously affect the pattern that is transferred to the radiation beam B and the pattern that is transferred to the substrate W. It may therefore be desirable to limit the size of the gap G in order to limit the size and/or the number of particles that pass into the volume between the pellicle 19 and the front side FS of the patterning device MA.

In an embodiment the gap G may have a width 35 in a range from 0.1 mm to 0.5 mm, for example a width between approximately 0.2 and 0.3 mm. In such an embodiment the gap G may be large enough that some particles are able to pass through the gap G. However when positioned in a lithographic apparatus LA the majority of particles that travel towards the mask assembly 15 may do so in a direction that does not align with the gap G. For example, particles may travel towards the mask assembly from a direction that causes them to collide with the pellicle 19 or the pellicle frame 17 but not to pass through the gap G. The gap G being larger than some particles present in the lithographic apparatus LA may not therefore be unduly problematic since the probability of a particle passing through the gap G may be relatively small.

In known mask assemblies in which a pellicle frame is glued to a patterning device it might be possible to configure a pellicle frame such that a gap is provided between the pellicle frame and the patterning device. However this would be difficult to achieve in practice because the glue may flow into the gap, reducing the size of the gap and potentially causing contamination through outgassing. These problems are avoided by the embodiment shown in FIG. 2C.

Figure 3:
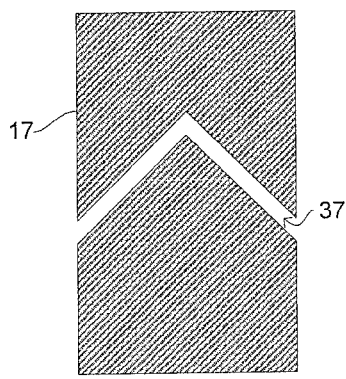
FIG. 3 is a schematic illustration of a portion of a mask assembly according to embodiments of the invention.

The pellicle frame 17 may further comprise additional gas channels, openings, valves and/or filters (not shown in FIGS. 2A-C), which allow for pressure equalization across the pellicle 19. The gas channels and/or filters may be configured so as to reduce or limit the number of particles that can pass into the volume between the pellicle 19 and the patterning device MA. FIG. 3 is a schematic illustration of a portion of a pellicle frame 17 in which a gas channel 37 is provided. The gas channel 37 is configured such that no direct unobstructed path is provided through the pellicle frame 17. A gas channel 37 that does not provide a direct unobstructed path through the pellicle frame 17 may be referred to as a labyrinth hole. Since the gas channel 37 does not provide a direct unobstructed path through the pellicle frame 17, particles that enter the gas channel 37 will collide with a wall of the gas channel 37 rather than passing through the gas channel 37. Providing a gas channel 37 in a labyrinth hole configuration may therefore reduce the number of particles that pass through the gas channel 37 when compared to a gas channel that provides a direct unobstructed path through the pellicle frame 17. The labyrinth hole may have any suitable configuration which does not provide a direct (line of sight) path through the pellicle frame 17.

In some embodiments a hole may be provided through a pellicle frame 17 which does provide a direct unobstructed path through the pellicle frame 17 but which does not provide a direct line of sight through the pellicle frame 17 to the patterning device MA. Providing a hole which provides a direct unobstructed path through the pellicle frame 17 may increase the rate at which gas can flow through the hole. A hole which provides a direct unobstructed path through the pellicle frame 17 does however provide a path through which contamination may pass through the pellicle frame 17. However, only contamination having a size which is smaller than the diameter of the hole and which arrives at the hole from a direction which lies within a limited angular range will be able to pass through the hole. Only a limited amount of contamination will therefore pass through the hole. Furthermore, since no direct line of sight is provided through the hole to the patterning device MA, any contamination which does pass through the hole will not be travelling towards the patterning device and therefore has a reduced chance of being deposited onto the patterning device MA.

A pellicle frame 17 may additionally or alternatively be provided with one or more filters that allow gas to pass through the pellicle frame 17 but prevent particles from passing through the pellicle frame 17. One or more filters may, for example, be provided on the sides of the pellicle frame 17 that extend parallel to the y-axis. Additionally or alternatively one or more filters may be provided on the sides of the pellicle frame 17 that extend parallel to the x-axis.

In some embodiments the mask assembly 15 may not include a gap G between the pellicle frame 17 and the patterning device MA and the pellicle frame 17 may be in contact with the patterning device MA. In such embodiments holes and/or filters may be provided in the pellicle frame 17 in order to allow gas to flow into and out of the volume between the pellicle 19 and the patterning device MA. Such a mask assembly may still be arranged such that the pellicle frame 17 is removably attached to the patterning device MA.

It can be seen from, for example, FIG. 2B that the provision of cut-away portions 25 in the patterning device MA allows for portions of the pellicle frame 17 to have a greater extent in the z-direction than if the patterning device MA did not include cut-away portions 25. The greater extent of the pellicle frame 17 in the z-direction advantageously provides additional space in which filters and/or gas channels in the pellicle frame 17 may be located.

The provision of cut-away portions 25 in the patterning device increases the volume that is available for a pellicle frame 17 therefore allowing the dimensions of the pellicle frame 17 to be increased. It may be desirable for the outer dimensions of the mask assembly 15 to remain substantially unchanged by any increase in the dimensions of the pellicle frame 17 since infrastructure may exist that is based upon the mask assembly 15 having given outer dimensions. In particular, the cut-away portions 25 allow for the extent of the pellicle frame 17 in the z-direction to be increased. For example, a mask assembly that does not include cut-away portions may include a pellicle frame 17 having an extent in the z-direction of approximately 2 mm, which is equal to the separation between the pellicle and the front side of the patterning device. The provision of cut-away portions 25 in the patterning device of FIGS. 2A-2C may allow the dimensions of the pellicle frame 17 in the z-direction to be extended to approximately 6 or 7 mm without changing the separation between the pellicle 19 and the front side FS of the patterning device MA or the outer dimensions of the mask assembly 15.

In another embodiment where no cut-away portions are used, an alternative manner to gain more volume for the pellicle frame is to shift outwards the position of non-pattern elements present on the mask such as sensors and alignment markers. In such way it can be arranged that a pellicle occupies for example an area of 126 mm×152 mm=19152 mm² which should not be intruded by tooling.

Whilst the embodiment that is shown in FIGS. 2A-C includes cut-away portions 25, some embodiments may not include cut-away portions 25. In such embodiments the extent of the pellicle frame 17 in the z-direction may be the same as the separation between the front side FS of the patterning device MA and the pellicle 19. In other words, the bottom surface of the pellicle frame 17 may lie on or adjacent to the front side FS of the patterning device MA.

Providing a pellicle frame 17 that is easily removable from the mask assembly 15 (by interaction with the attachment interfaces 33 provided on the sub-frames 27) may allow the extent of the pellicle frame in directions other than the z-direction to be increased. For example, the dimensions of the pellicle frame 17 may be increased (relative to a common mask assembly) in the x and/or the y-directions without increasing the outer dimensions of the mask assembly 15.

It may be desirable for some regions of the patterning device MA to be accessible in order to perform one or more processes involving the patterning device MA. For example, the patterning device may be handled (e.g., outside of a lithographic apparatus) using a tool that requires access to given reserved regions of the patterning device MA. A patterning device MA that includes a permanently attached pellicle frame may therefore only include limited regions that are available for the pellicle frame in order to preserve access to the given reserved regions of the patterning device. These restraints on the regions of the patterning device that may be used for a pellicle frame may limit the extent of the pellicle frame, for example, in the x and/or y-directions. In contrast to common mask assemblies, providing a pellicle frame 17 that is easily removable from the mask assembly 15 may allow the pellicle frame 17 to cover regions of the patterning device MA that are reserved for use in some process (e.g., handling of the patterning device) since access to the reserved regions may be achieved by removing the pellicle frame 17 from the patterning device MA. The extent of the pellicle frame 17, for example, in the x and/or y-directions may therefore be increased whilst still providing access to reserved regions of the patterning device MA.

Increasing the dimensions of the pellicle frame 17 (e.g. to have a width of between 3 mm and 5 mm) may increase the strength and/or the stiffness of the pellicle frame 17. Increasing the strength and/or the stiffness of the frame may advantageously reduce any bending or distortion of the pellicle frame 17 that may occur. For example, the pellicle 19 may be applied to the pellicle frame 17 in such a way that the pellicle 19 is mechanically stressed such that there is tension in the pellicle 19. Tension in the pellicle 19 may serve to pull the sides of the pellicle frame 17 towards each other, which may lead to the pellicle 19 sagging towards the patterning device MA. An increase in the stiffness of the pellicle frame 17 increases the resistance of the frame 17 to being distorted by tension in the pellicle 19. Increasing the resistance of the frame 17 to being distorted by tension in the pellicle 19 may allow the pellicle 19 to be applied to the frame 17 with a greater degree of tension (without causing distortion of the frame 17). Applying the pellicle 19 to the pellicle frame 17 with a greater degree of tension may advantageously increase the resistance of the pellicle to bending when subjected to a pressure difference across the reticle.

An increase in the strength and/or the stiffness of the pellicle frame 17 may be caused by an increase in the dimensions of the pellicle frame 17. The stiffness of the pellicle frame 17 may additionally be increased by the interaction of the pellicle frame 17 with sides of the cut-away portions 25 of the patterning device MA and with sides of the sub-frames 27. The sides of the cut-away portions 25 and the sub-frames 27 that are in contact with the pellicle frame 17 provide a surface against which the pellicle frame 17 bears when subjected to an inward pulling force (e.g., caused by tension in the pellicle 19). The interaction between the pellicle frame 17 and sides of the cut-away portions 25 and the sub-frames 27 therefore increases the resistance of the frame 17 to bending or distortion of the frame 17.

An additional advantage of the cut-away portions 25 of the patterning device MA is that they provide a means to accurately position the pellicle frame 17 on the patterning device. A known patterning device that does not include a cut-away portion and to which a pellicle frame may be glued does not provide any interface that dictates the position of the pellicle frame relative to the patterning device. The position of the pellicle frame is not therefore restrained and depends on the accuracy with which the pellicle frame is glued to the patterning device. The cut-away portions 25 of the patterning device MA of FIGS. 2A-C advantageously provide a restraint on the position of the pellicle frame 17 relative to the patterning device MA thereby increasing the accuracy with which the pellicle frame 17 is positioned on the patterning device MA.

Figure 4A:
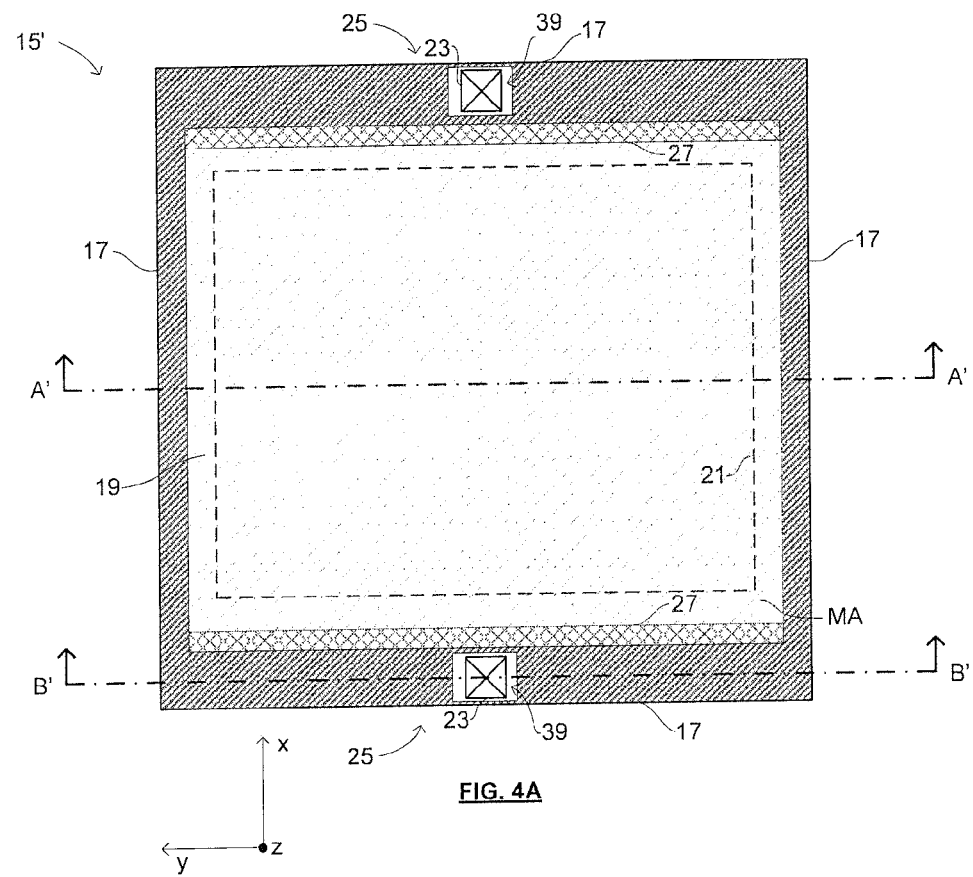
FIGS. 4A, 4B and 4C are schematic illustrations of a mask assembly according to an alternative embodiment of the invention.
Figure 4B:
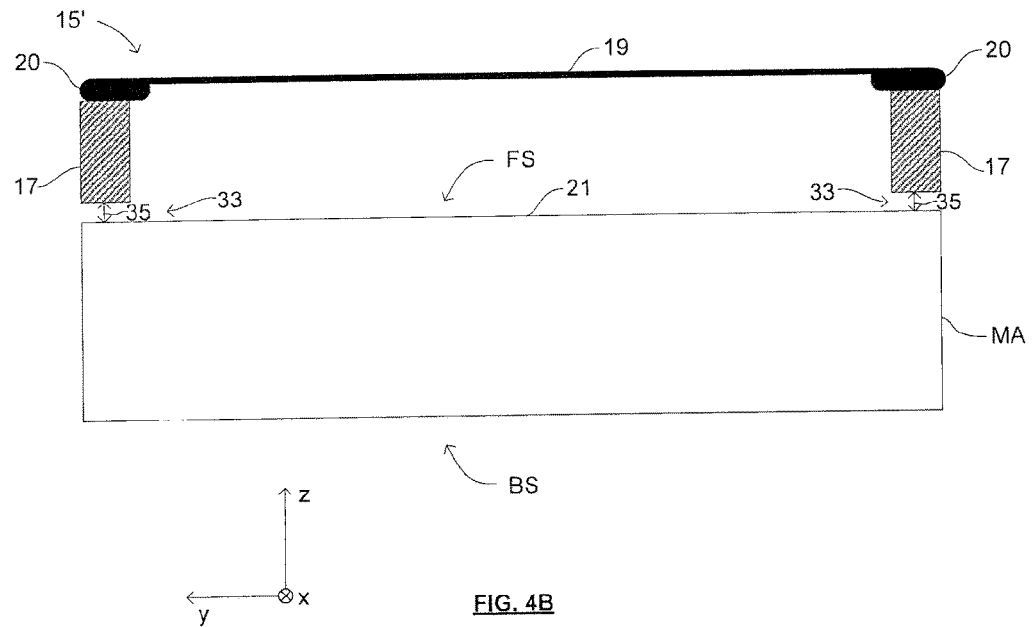
Figure 4C:
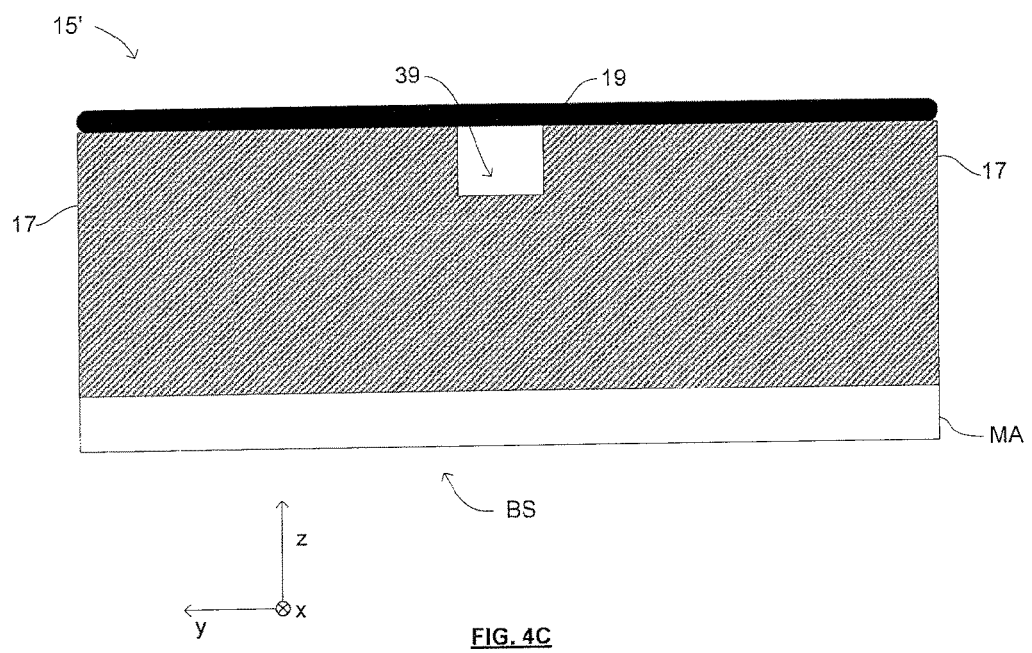

FIGS. 4A, 4B and 4C are schematic illustrations of a mask assembly 15' according to an alternative embodiment of the invention. FIG. 4A shows a plan view of the mask assembly 15'. FIG. 4B shows a cross-section of the mask assembly 15' along the line A'-A', which is shown in FIG. 4A. FIG. 4C shows a cross-section of the mask assembly 15' along the line B'-B', which is shown in FIG. 4A. Features of the embodiment of the mask assembly 15' shown in FIGS. 4A-C that are the same or equivalent to features of the embodiment of the mask assembly 15 shown in FIGS. 2A-C are denoted with like reference numerals. For brevity, a detailed description of like features with reference to FIGS. 4A-C is not given since these features will be readily understood from the description of FIGS. 2A-C.

The mask assembly 15', which is shown in FIGS. 4A-C, includes a pellicle frame 17 that extends around the full extent of the patterning device MA in both the x and y-directions. In contrast to the mask assembly 15 of FIGS. 2A-C, cut-away portions 25 of the patterning device MA and sub-frames 27 are provided on sides of the mask assembly 15' that extend parallel to the y-axis (as opposed to sides of the mask assembly 15 that extend parallel to the x-axis as in FIGS. 2A-C). The sides of the pellicle frame 17 that extend parallel to the x-axis do not reach fully to the front side FS of the patterning device MA. As a result, a gap G is present between the front side FS of the patterning device MA and the pellicle frame 17. The pellicle frame 17 may be considered to be suspended relative to the patterning device MA. As was explained with reference to FIGS. 2A-C a gap G between the front side FS of the patterning device MA and the pellicle frame 17 allows gas to flow into and out of the volume between the pellicle 19 and the patterning device MA so as to allow for pressure equalization across the pellicle 19.

In the mask assembly 15' of FIGS. 4A-C extending the pellicle frame 17 in the x-direction such that the extent of the pellicle frame 17 in the x-direction is equivalent to the extent of the patterning device MA causes the pellicle frame 17 to overlap with regions of the patterning device MA on which alignment marks 23 are provided. During alignment of the mask assembly 15 the alignment marks 23 may be illuminated with an alignment radiation beam (not shown) and the reflection of the alignment radiation beam from the alignment marks 23 may be measured. In order to allow alignment of the patterning device MA when the pellicle frame 17 is fitted to the patterning device MA a window 39 is provided in the body of the pellicle frame 17 (as shown in FIGS. 4B and 4C) through which the alignment radiation beam and/or the reflected alignment radiation beam may propagate. The window 39 may be covered with a transparent material in order to prevent particles from propagating through the window 39.

In some embodiments a plurality of windows 39 may be provided in the pellicle frame 17 in order to allow radiation to propagate towards and/or away from a plurality of alignment marks 23. In some embodiments marks other than alignment marks may be provided on the patterning device MA with which interaction with the radiation is needed. For example, one or more identification marks (e.g., one or more bar codes) or alignment sensors may be provided on the patterning device MA in order to identify the patterning device. Similarly to an alignment mark 23, an identification mark may be read by illuminating the identification mark with an identification radiation beam and measuring a reflected identification radiation beam that is reflected from the identification mark. One or more windows 39 may be provided in the pellicle frame 17 in order to read one or more identification marks that are provided on the patterning device MA.

It can be seen from a comparison of FIGS. 4A and 2A that in the embodiment of the mask assembly 15' shown in FIG. 4A, the sub-frames 27 to which the pellicle frame 17 is attached are positioned further from the patterned area 21 than in the embodiment of the mask assembly 15, which is shown in FIG. 2A. A larger separation between the point at which the pellicle frame 17 is attached to the patterning device MA and the patterned area 21 may advantageously reduce any impact of the pellicle frame 17 attachment on the patterned area 21. For example, whilst efforts may be made to contain the products of outgassing from a glue 31 (e.g., by positioning the glue 31 in recesses 29 in the sub-frames 27) products of outgassing may still be emitted. In the event that products of outgassing are emitted, increasing the distance between the point of emission (e.g., the sub-frames 27) and the patterned area 21 (as is achieved by the arrangement shown in FIGS. 4A-C) may advantageously reduce the impact of the products of outgassing on the patterned area 21.

During use in a lithographic apparatus a mask assembly is exposed to radiation (e.g., EUV radiation). A portion of the radiation to which the mask assembly is exposed may be absorbed by components of the mask assembly that may lead to heating of components of the mask assembly. Heating components of the mask assembly may lead to expansion of the heated components. In particular, components of the mask assembly may be heated and may expand at different rates and by different amounts that may lead to components of the mask assembly becoming stressed. For example, the pellicle frame 17 and the patterning device MA may expand at different rates. Points at which the pellicle frame 17 is attached to the patterning device MA may therefore, in particular, be points on the patterning device MA and/or the pellicle frame 17 that may be subjected to stress. Stressing of the patterning device MA may lead to distortion of the patterning device MA. If the patterning device MA is stressed and distorted at a position that is close to the patterned area 21 of the patterning device MA then the pattern that is provided on the patterned area 21 may become distorted. Distortion of the pattern that is provided on the patterned area 21 may lead to undesirable distortion of the pattern that is transferred to a substrate W. It may therefore be desirable to increase the distance between points on the patterning device MA that are subjected to stress and the patterned area 21 in order to reduce any distortion of the pattern that is provided on the patterned area 21. It may therefore be desirable to increase the distance between points at which the pellicle frame 17 is attached to the patterning device MA and the patterned area 21 (as is achieved by the mask assembly 15' depicted in FIGS. 4A-C).

Embodiments of a mask assembly 15, 15', which have been described above with reference to FIGS. 2A-C and 4A-C, include several different features (e.g., cut-away portions 25, a gap G and sub-frames 27). However, some embodiments of the invention may not include all of the features of the embodiments of FIGS. 2A-C and 4A-C. For example, some embodiments may include cut-away portions 25 in the patterning device but may not include the sub-frames 27. In such embodiments a pellicle frame may be attached to the patterning device MA by gluing the pellicle frame to the patterning device MA (as opposed to attachment via attachment interfaces 32). In other embodiments a mask assembly may include sub-frames 27 including attachment interfaces 32 but may not include cut-away portions 25. In general any feature of any of the described embodiments may be used in isolation or may be used in any combination with any of the other features of the described embodiments.

Figure 5:
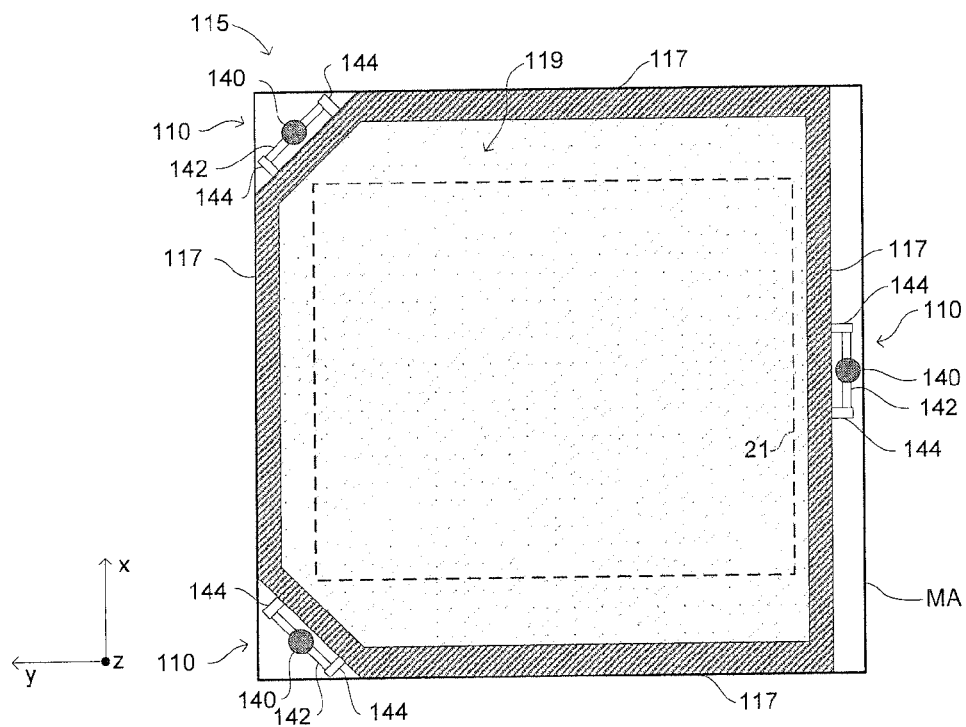
FIG. 5 is a schematic illustration of a mask assembly according to a further alternative embodiment of the invention.

FIG. 5 is a schematic illustration of a mask assembly 115 according to an alternative embodiment of the invention. The mask assembly 115 comprises a patterning device MA and a pellicle frame 117, which supports a pellicle 119. The patterning device MA includes a patterned area 21. The pellicle frame 117 is attached to the patterning device MA via a mount comprising three sub-mounts 110. The sub-mounts 110 are configured to allow sections of the pellicle frame 17 to move relative to the patterning device MA. The sub-mounts 110 may together function as a kinematic mount for the pellicle frame 117. More than three sub-mounts may be provided.

The sub-mounts 110 each comprise a protrusion 140 (which may be referred to as a stud) that is attached to and extends from the patterning device MA. The protrusion 140 may, for example, be glued to the patterning device MA. In some embodiments the protrusion 140 may be positioned in a cut-away portion of the patterning device MA (not shown in FIG. 5). In some embodiments the protrusion 140 may be releasably secured to a sub-frame (not shown in FIG. 5) that is attached to the patterning device MA thereby allowing the pellicle frame 117 to be conveniently attached and detached from the patterning device MA.

The protrusion 140 is attached to a leaf spring 142 that is coupled to the pellicle frame 117 via brackets 144. The brackets 144 may be rigid. The leaf springs 142 allow for movement of a section of the pellicle frame 117 relative to the pins 140 that are attached to the patterning device MA. The leaf springs 142 in the sub-mounts 110 therefore allow for movement of sections of the pellicle frame relative to the patterning device 110.

Allowing movement of sections of the pellicle frame 117 relative to the patterning device MA via the kinematic mount arrangement, which is shown in FIG. 5, advantageously allows independent expansion and contraction of the patterning device MA and the pellicle frame 117 without inducing a stress in the patterning device. For example, if the pellicle frame 117 is heated and expands relative to the patterning device MA then the expansion of the pellicle frame 117 may cause flexing of the leaf springs 142. The expansion of the patterning device MA may therefore be absorbed by the leaf springs 142 instead of inducing a stress in the patterning device MA.

Whilst the sub-mounts 110 allow sections of the pellicle frame 117 to move relative to the patterning device MA so as to allow expansion and contraction of the pellicle frame 117 relative to the patterning device it may be desirable to restrain movement of the pellicle frame 117 as a whole relative to the patterning device. For example, each sub-mount 110 may be configured to restrain the movement of the pellicle frame at that sub-mount to a limited number of degrees of freedom (i.e. such that movement in one direction is prevented at that sub-mount). The combination of restraining the movement of the pellicle frame 117 at each sub-mount 110 may act so as to prevent movement of the pellicle frame 117 as whole relative to the patterning device MA such the pellicle frame 117 as a whole is fixed relative to the patterning device MA. That is, the sub-mounts 110 allow the pellicle frame 117 to expand and contract but act to prevent significant translation or rotation of the pellicle frame 117 relative to the patterning device MA.

Whilst the embodiment of FIG. 5 includes leaf springs that allow sections of the pellicle frame 117 to move relative to the patterning device MA, in general any flexible element may be used. The flexible element may be an elastic element. In some embodiments the flexible element may be part of the pellicle frame itself. For example, the pellicle frame may be attached to a mount at an attachment point. Portions of the pellicle frame adjacent to the attachment point may be cut out of the frame such that a portion of the frame including the attachment point is flexible, thereby allowing movement of the attachment point relative to the rest of the frame.

The kinematic mount arrangement of FIG. 5 reduces the points at which the pellicle frame 117 is attached to the patterning device MA to the three pins 140. In embodiments in which a glue (which may also be referred to as adhesive) is used to attach the pins 140 to the patterning device MA, the glue will only be used in regions at which the three pins 140 are attached to the patterning device MA (as opposed to, for example, the length of each of the sub-frames 27 in the embodiments of FIGS. 2A-C and FIGS. 4A-C). Reducing the regions of the mask assembly 115 in which a glue is used advantageously reduces the impact of outgassing from the glue.

In the kinematic mount arrangement of FIG. 5 the extent of the pellicle frame 117 in the z-direction may be such that a gap is left between the pellicle frame 117 and the front side of the patterning device MA. The gap allows gas to flow into and out of the volume between the pellicle 119 and the patterning device MA so as to allow for pressure equalization across the pellicle 119. The arrangement of sub-mounts 110 that is shown in FIG. 5 is merely an example of a kinematic mount arrangement that may be used to mount a pellicle frame 117 on a patterning device MA so as to allow movement of the pellicle frame 117 relative to the patterning device MA. In other embodiments other arrangements of one or more sub-mounts may be used to mount a pellicle frame 117 on a patterning device MA. Each sub-mount may provide an attachment between the patterning device and the pellicle frame at a different position. Each sub-mount may include a flexible component configured to allow movement of the pellicle frame relative to the patterning device at that position.

The one or more sub-mounts may comprise one or more flexible elements (e.g., leaf springs 142) that allow sections of the pellicle frame 117 to move relative to the patterning device MA so as to reduce any stress that is induced in the patterning device MA due to thermal expansion of the pellicle frame 117 and/or the patterning device MA. The one or more sub-mounts may constrain the movement of the pellicle frame 117 relative to the patterning device MA at each sub-mount 110 to a discrete number of degrees of freedom (i.e. such that movement in one direction is prevented at that sub-mount). The combination of a plurality of sub-mounts 110 may act to constrain movement of the pellicle frame 117 as a whole relative to the patterning device MA so as to prevent significant translation or rotation of the pellicle frame 117 as a whole relative to the patterning device MA.

Figure 6:
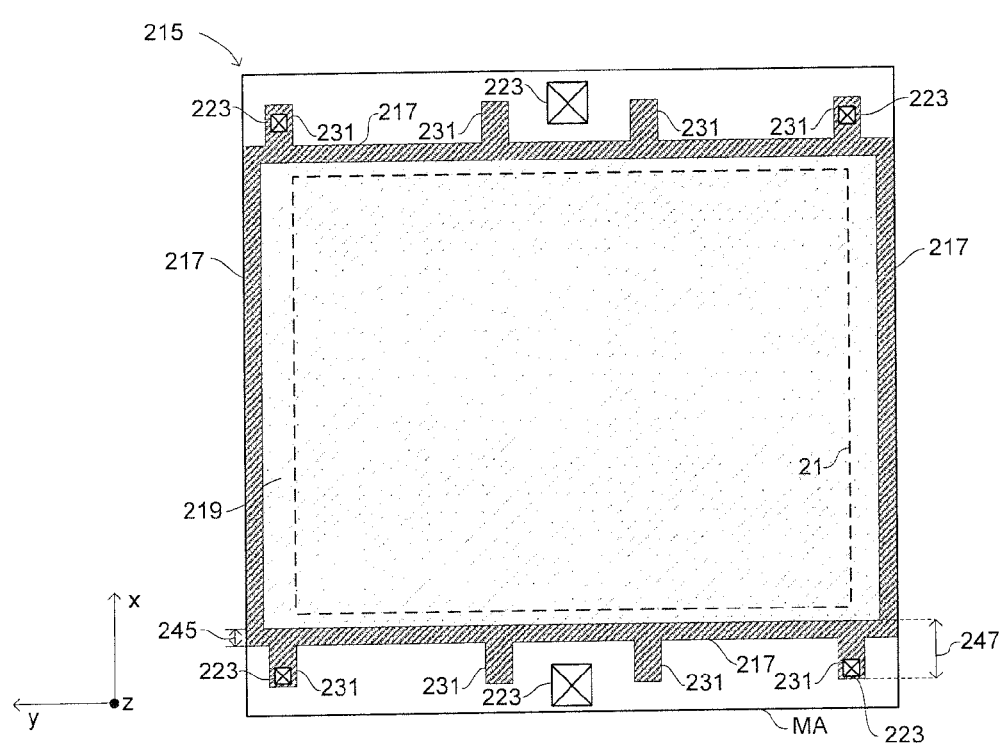
FIG. 6 is a schematic illustration of a mask assembly according to a still further alternative embodiment of the invention.

FIG. 6 is a schematic illustration of a mask assembly 215 according to an alternative embodiment of the invention. The mask assembly 215 comprises a patterning device MA and a pellicle frame 217, which supports a pellicle 219. The patterning device MA includes a patterned area 21. The pellicle frame 217 extends around the patterned area 21 so as to surround the patterned area 21.

The pellicle frame 217 includes extended portions 231 that have an increased extent in the x-direction when compared with the rest of the pellicle frame 217. The extended portions 231 may be considered to be ribs. Portions of the pellicle frame 217 that do not form the extended portions 231 may be referred to as non-extended portions. The width 247 of the pellicle frame 217 at the extended portions is greater than the width 245 of the pellicle frame 217 at the non-extended portions.

FIG. 7 is a schematic illustration of a close-up view of a portion of the pellicle frame 217. The portion of pellicle frame 217 that is shown in FIG. 7 includes an extended portion 231. The pellicle 219 includes a border portion 220 in the region of the pellicle 219 that is attached to the pellicle frame 217. The border portion 220 has an increased thickness relative to the main film of the pellicle 219. The border portion 220 may be used to grip the pellicle 219 during handling of the pellicle 219 (e.g., during attachment and detachment of the pellicle 219 from the pellicle frame 217).

The width of the border portion 220 of the pellicle 219 may be limited by the width 245 of the pellicle frame 217. In some embodiments, the border portion may extend inwardly beyond the extent of the pellicle frame 217. However, it may be desirable for portions of the pellicle that transmit a radiation beam B to be formed from the main pellicle film and not from the border portion 220. The extent to which the border portion extends beyond the pellicle frame 217 may therefore be limited by the need for the pellicle 219 to transmit a radiation beam B. The width 245 of the pellicle frame 217 may be limited by space requirements on the patterning device MA. For example, it may be desirable to leave regions of the patterning device MA free from the pellicle frame 217 in order to use these regions of the patterning device MA for other purposes (e.g., to position alignment marks 223 and/or identification marks).

In some embodiment the width 245 of the pellicle frame may be limited to approximately 2 mm or less. In such embodiments the width of the border portion 220 of the pellicle 219 may also be limited to approximately 2 mm or less. For some applications it may be desirable for the width of the border portion 220 to be greater than 2 mm in order to enable handling of the pellicle 219 (e.g., by gripping the border portion of the pellicle). The provision of extended portions 231 of the pellicle frame 217 in the embodiment shown in FIGS. 6 and 7 allows the border portion 220 of the pellicle 219 to be extended at positions on the pellicle 219 that correspond with the extended portions 231 of the pellicle frame 217. The width 247 of the pellicle frame 217 at the extended portions 231 may, for example, be approximately 5 mm. The extended portions 231 may therefore allow the border portion 220 of the pellicle 219 to have a width of approximately 5 mm in regions of the pellicle 219 that correspond to the extended portions 231 of the pellicle frame 217. The provision of regions of the border region 220 of the pellicle 219 that have an increased width (e.g., a width of approximately 5 mm) provides regions of the pellicle 219 that may be conveniently gripped during handling of the pellicle.

The extended portions 231 of the pellicle frame 217 may be positioned at regions of the patterning device MA that are not required for other purposes. For example, the extended portions 231 may extend around alignment marks 223 and/or identification marks (not shown in FIG. 6) on the patterning device MA so as not interfere with the alignment marks 223 and/or identification marks. The extended portions 231 may be provided with windows such that they can extend over alignment marks 223 and/or identification marks whilst allowing those marks to remain visible.

In some embodiments the extended portions 231 of the pellicle frame 217 may be used for additional purposes. For example, one or more of the extended portions 231 may be provided with one or more alignment marks 223 (as shown in FIG. 6) thereby reducing the amount of space on the patterning device MA that is required for alignment marks. The alignment marks 223 provided on the extended portions 231 may be of the same type or may be different from alignment marks 223 on the patterning device MA. In some embodiments the alignment marks 223 that are provided on the extended portions 231 of the pellicle frame 217 may be used to check the alignment of the pellicle frame 217 relative to the patterning device MA. The extended portions 231 having alignment marks 223 may be used to align the pellicle film with the patterning device MA and pellicle frame 217. Alignment marks 223 may also be placed at backside of the pellicle frame (i.e. the surface facing the patterning device MA). Hence, alignment through the patterning device may be possible for instance if a blank area on the patterning device is provided. This may also be useful when aligning the pellicle with the patterning device MA and pellicle frame 217. In such case the alignment of the patterning device with frame versus the pellicle may be done from backside, whereas alignment of the pellicle may be done from the front side.

As has been described above in the context of other embodiments of a mask assembly, it is desirable to provide means for gas to flow into and out of the volume between a pellicle 219 and a patterning device MA in order to allow for pressure equalization across the pellicle 219. In some embodiments a means for gas flow may be provided with holes that extend through the pellicle frame 217 (e.g., one or more labyrinth holes as shown in FIG. 3).

Providing holes in the pellicle frame 217 may structurally weaken the pellicle frame 217 in regions in which the holes are provided. In some embodiments one or more holes may be provided through the pellicle frame 217 in the extended portions 231 of the pellicle frame 217. The extended portions 231 of the pellicle frame 217 have an increased width when compared to non-extended portions of the pellicle frame 217 and thus the pellicle frame 217 may be mechanically stronger at the extended portions 231. Weakening the pellicle frame 217 by providing holes through the pellicle frame 217 therefore has a reduced impact in the extended portions 231 of the pellicle frame 217 since the extended portions 231 have an increased mechanical strength (compared to non-extended portions of the pellicle frame 217).

FIG. 8A is a schematic illustration of a portion of a pellicle frame 217' according to an alternative embodiment of the invention. The pellicle frame 217' includes extended portions 231' having a width 247' that is greater than the width 245' of a non-extended portion of the pellicle frame 217'. The pellicle frame 217' that is shown in FIG. 8A is the same the pellicle frame 217 of FIGS. 6 and 7 except that the extended portions 231' of the pellicle frame 217' include a hollowed section 261 around which the frame 217' extends. For ease of illustration no pellicle is shown in FIG. 8A.

FIG. 8B is a schematic illustration of a portion of a pellicle 219' that is suitable for fitting to the pellicle frame 217' of FIG. 8A. The pellicle 219' includes a border portion 220'. The width of the border portion 220' is increased in a region that corresponds with the extended portion 231' of the pellicle frame 217'. The region of the border portion 220' that has an increased width includes a region 263 in which pores are formed in the pellicle 219'. The pores may be provided for example by inclusion of a porous material in which the pores are randomly distributed such as in aerogels, or by providing pores distributed in a given direction such as in form of parallel rows. The pores are configured to allow gas to flow through the pellicle 219'. When the pellicle 219' is fitted to the pellicle frame 217' the region 263 including pores is aligned with the hollowed section 261 of the pellicle frame 217' thereby enabling gas to flow through the pores and into and out of the volume between the pellicle 219' and the patterning device MA. The region 263 of the pellicle 219' that includes pores therefore enables pressure equalization across the pellicle 219'.

By providing pores in the in the pellicle 219' the number of holes and/or filters in the pellicle frame 217' may be reduced or eliminated since gas is able to flow into and out of the volume between the pellicle 219' and the patterning device MA via the pores in the pellicle 219'. Reducing or eliminating the number of holes and/or filters in a pellicle frame 217' may advantageously increase the strength of the pellicle frame 217'.

Various embodiments of a mask assembly have been described above in which a pellicle is held in position above a patterning device MA by way of a pellicle frame. During use an electric charge may build up on a pellicle. For example, exposure of the pellicle to EUV radiation may lead to charge build up on the pellicle. Additionally or alternatively charge may build up on the pellicle due to electrostatic clamping of the patterning device MA. Electrostatic clamping of the patterning device MA may cause the patterning device MA to become charged such that the patterning device MA and the pellicle act as a capacitor and a potential difference exists between the patterning device MA and the pellicle, thereby leading to a charge build up on the pellicle. It may be desirable to provide a means to dissipate electric charge from the pellicle in order to avoid electrical discharge occurring between the pellicle and another component of a lithographic apparatus LA. In order to dissipate electric charge from the pellicle an electrically conductive path may be provided between the pellicle and the patterning device.

FIG. 9 is a schematic illustration of a portion of a mask assembly 315 in which an electrically conductive path is provided between a pellicle and a patterning device MA. The mask assembly 315 includes a pellicle frame 317 that is secured to a patterning device MA with glue 331 (which may also be referred to as adhesive). Other forms of attachment are also envisaged herein. A pellicle 319 that includes a border portion 320 is secured to the pellicle frame 317 with glue 331. Some glues may be electrically conductive and may therefore provide a conductive path between the pellicle 319 and the pellicle frame 317 and between the pellicle frame 317 and the patterning device MA. However some glues are not electrically conductive and thus do not provide a conductive path between components of the mask assembly 315. In order to provide a conductive path between components of the mask assembly 315 electrically conductive material 332 is positioned between the pellicle 319 and the pellicle frame 317 and between the pellicle frame 317 and the patterning device MA. The electrically conductive material 332 may, for example, be a solder material. The provision of electrically conductive material 332 may be referred to as bump bonds and may be similar to bump bonds that are provided between semi-conductor devices.

The pellicle frame 317 may be electrically conductive. For example, the pellicle frame 317 may be formed from a conductive metal. The provision of electrically conductive material 332 between the pellicle 319 and the pellicle frame 317 and between the pellicle frame 317 and the patterning device MA may therefore allow provide a conductive path between the pellicle 319 and the patterning device MA (through the pellicle frame 317). Electric charge that may build up on the pellicle may therefore be dissipated via the conductive path.

Various embodiments of a mask assembly have been described above in which a glue (which may also be referred to as adhesive) is used to secure components of the mask assembly together. However as has been described above the use of glue in a mask assembly may results in outgassing from the glue that may contaminate the environment in which the mask assembly is positioned. In order to avoid the use of glue in a mask assembly, in some embodiments components of a mask assembly may be secured together using optical contact bonding (as opposed to using glue). Optical contact bonding occurs when two surfaces are closely conformed to each other such that when the surfaces are brought together the intermolecular forces (e.g., Van der Waals forces) between the surfaces are sufficient to secure the surfaces to each other.

Optical contact bonding may, for example, be used to secure a pellicle frame to a patterning device MA. In order to secure a pellicle frame to a patterning device MA a surface of the pellicle frame and a region of the patterning device may need to be sufficiently smooth in order to enable optical contact bonding. In some embodiments a region of the patterning device MA may be treated in order to make it sufficiently smooth in order to enable optical contact bonding. In other embodiments, a film may be deposited onto a region of the patterning device in order to enable optical contact bonding between the film and a pellicle frame. The film may, for example, be patterned onto the patterning device using a lithographic process.

A pellicle frame may be secured to a patterning device using optical contact bonding in such a way that enables convenient removal of the pellicle frame from the patterning device when required (e.g., to replace the pellicle). The use of optical contact bonding in a mask assembly advantageously reduces the need to use glue in the mask assembly thereby avoiding the effects of outgassing from the glue. In some embodiments, some components of a mask assembly may be secured together using optical contact bonding and some components may be secured together with glue. In some embodiments one or more components of a mask assembly may be secured together with a mechanical interface (e.g., the attachment interfaces 32 shown in FIG. 2B).

In some embodiments a pellicle frame may be attached to a patterning device using other forms of bonding. For example, anodic bonding or hydroxyl bonding may be used to attach a pellicle frame to a patterning device.

Optical or other forms or bonding and contacting may sometime require molecularly smooth and flat mating surfaces. In an embodiment it is proposed herein to covalently bond a polymer film to a surface of the pellicle frame or to the base of the removable protrusion (stud) which is to be bonded to a mask. By a covalent bonding it is meant herein an irreversible bonding whereby it is ensured that the polymer film remains fixed to the base of the protrusion under normal conditions (e.g. unless abrasion or ashing are used). The thickness of the polymer film is preferably less than 1 micron, more preferably less than 100 nm. In an embodiment, a polymer film coated surface of a protrusion (stud) or pellicle frame surface may be pressed onto a clean mask under clean conditions in order to achieve bonding between the protrusion and the mask.

Because the mated surfaces are smooth, flat and clean, the polymer film deforms to make a Van der Waals contact with the mask surface, and may provide a bond strengths in the order of for example 10 MPa. Because the polymer film is relatively thin, it may be free of organic outgassing materials, and may be mechanically stiff and stable against moisture. Since the polymer film will not be exposed to the vacuum or only to a very small extent at the edge of the bonded surface, exposure of the polymer film to reactive species in the surrounding environment is minimized. An advantage of polymer film bonding is that, due to the polymer film being bonded covalently (i.e. irreversibly) to the surface of a removable element (e.g. pellicle frame surface, or base of protrusion) and bonded via Van der Waals forces (i.e. reversibly) to the mask, the removable element may be cleanly peeled away from the mask.

For example, a glass stud (or its base surface) may be treated with a trimethoxy silane secondary amine to create a covalent bonding to the glass, then a secondary amine may be used to initiate reaction with a bisphenol A diglycydyl ether.

Figure 10:
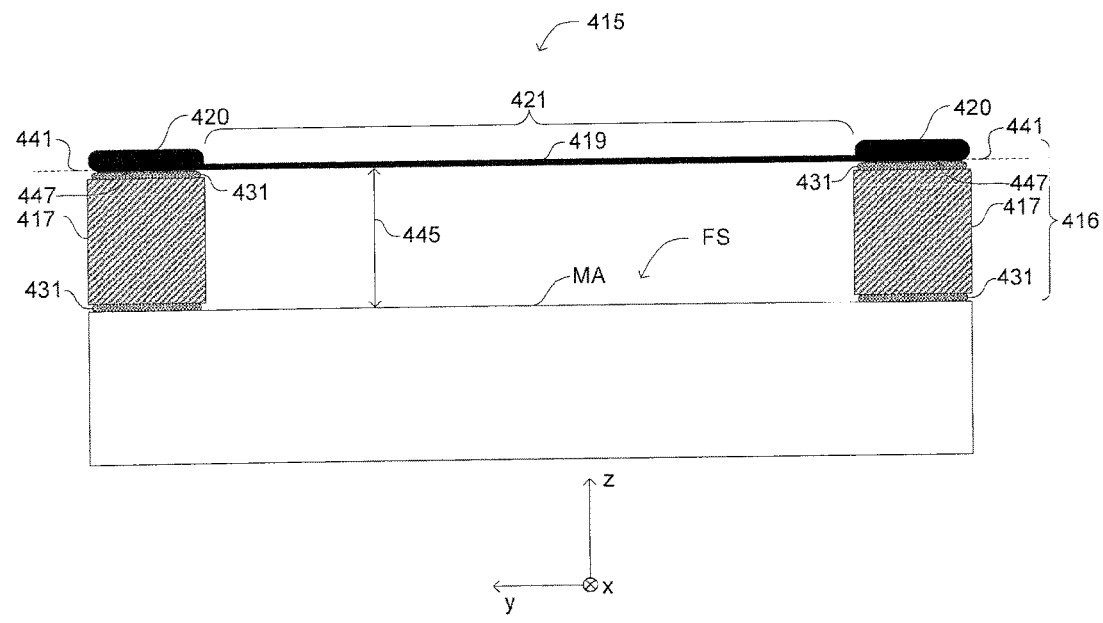
FIG. 10 is a schematic illustration of a pellicle assembly according to an embodiment of the invention and a patterning device to which the pellicle assembly is attached.

FIG. 10 is a schematic illustration of a mask assembly 415 according to an embodiment of the invention. The mask assembly 415 includes a pellicle assembly 416 which comprises a pellicle frame 417 and a pellicle 419. The pellicle frame 417 is suitable for attachment to a patterning device MA and is shown in FIG. 10 as being attached to a patterning device MA with glue 431 (which may also be referred to as adhesive). The pellicle frame 417 is attached to a front side FS of the patterning device MA on which a pattern is formed.

The pellicle 419 is supported by the pellicle frame 417. In the embodiment which is shown in FIG. 10 the pellicle 419 is attached to the pellicle frame 417 with glue 431. In other embodiments the pellicle 419 may be attached to the pellicle frame 417 by other means (e.g. by optical contact bonding). The pellicle 419 comprises a thin film portion 421 and a border portion 420. The thin film portion 421 extends across the pellicle frame 417 and defines a plane 441 (i.e. the thin film portion 421 lies in the plane 441). The border portion 420 is attached to the pellicle frame 417 (with glue 431 in the example shown in FIG. 10) and has a thickness which is greater than the thickness of the thin film portion 421. It can be seen in FIG. 10 that the border portion 420 extends out of the plane 441 defined by the thin film portion 421 and away from the pellicle frame 417. The pellicle 419 which is shown in FIG. 10 has thus been flipped, relative to the pellicle frame 417, when compared with the embodiments which are shown in, for example, FIGS. 2B, 4B and 9, in which the border portion extends out of a plane defined by a pellicle and towards a pellicle frame.

Arranging a pellicle 419 such that the border portion extends out of a plane 441 defined by a thin film portion 421 of the pellicle 419 and away from a pellicle frame 417 advantageously allows the extent of the pellicle frame 417 in the z-direction to be increased without changing a separation 445 between the thin film portion 421 of the pellicle 419 and the front side FS of the patterning device MA. It may be desirable to arrange a pellicle 419 such that there is a given separation 445 between the thin film portion 421 of the pellicle 419 and the front side FS of the patterning device. The given separation 445 between the thin film portion 421 and the front side FS of the patterning device MA may correspond with an industry standard and/or may provide desired optical properties. For example, it may be desirable to arrange the pellicle 419 such that the separation 445 between the front side FS of the patterning device MA and the thin film portion 421 is approximately 2 mm, up to 2.5 mm or even up to 3 mm (e.g. between 2 mm and 3 mm).

In embodiments in which a border portion extends out of a plane defined by a thin film portion of a pellicle and towards a pellicle frame (for example as is shown in FIGS. 2B, 4B and 9) the extent of the pellicle frame in the z-direction and the thickness of the border portion in the z-direction both lie in between the thin film portion of the pellicle and the front side FS of the patterning device MA. The extent of the pellicle frame in the z-direction is therefore limited by the thickness of the border portion of the pellicle in such embodiments. In contrast to the arrangement which is shown in FIGS. 2B, 4B and 9, in the embodiment which is shown in FIG. 10 in which the border portion 420 extends out of the plane 441 defined by the thin film portion 421 of the pellicle 419 and away from the pellicle frame 417, almost the entire extent in the z-direction of the separation 445 between the front side FS of the patterning device MA and the thin film portion 421 of the pellicle 419 is available for the pellicle frame 417. The extent of the pellicle frame 417 in the z-direction may therefore be increased.

As was described above with reference to other embodiments of the invention, increasing the extent of the pellicle frame 417 in the z-direction advantageously increases the space on the pellicle frame 417 which is available for providing means for gas to flow (e.g. through one or more filters and/or holes provided in the pellicle frame 417) into and out of the volume between the pellicle 419 and the patterning device MA in order to allow for pressure equalization across the pellicle 419. Increasing the extent of the pellicle frame 417 in the z-direction may additionally allow the tension of the pellicle 419 when attached to the pellicle frame 417 to be increased due to an increase in strength of the pellicle frame 417.

In the arrangement which is shown in FIG. 10 the entire thickness of the border portion 420 extends out of the plane 441 and away from the pellicle frame 417. The result of this arrangement is that a first surface 447 of the border portion 420 at which the border portion 420 is attached to the pellicle frame 417 is substantially coplanar with the plane 441 which is defined by the thin film portion 421 of the pellicle 419. In embodiments in which the first surface 447 of the border portion 420 is substantially coplanar with the plane 441 which is defined by the thin film portion 421 of the pellicle 419, the separation 445 between the thin film portion 421 of the pellicle 419 and the front side FS of the patterning device depends largely on the extent in the z-direction of the pellicle frame 417 and does not depend on the thickness in the z-direction of the border portion 420. This may advantageously increase the accuracy with which the position of the thin film portion 421 of the pellicle 419 in the z-direction may be controlled since it no longer depends on the thickness of the border portion 420.

In other embodiments, in addition to a portion of the border portion 420 which extends out of the plane 441 and away from the pellicle frame 417, the border portion 420 may also include some thickness which extends out of the plane 441 and towards the pellicle frame 417. In such embodiments the first surface 447 of the border portion 420 may not be coplanar with the plane 441 which is defined by the thin film portion 421 of the pellicle 419. In some embodiments the thickness of the border portion 420 which extends out of the plane 441 and away from the pellicle frame 417 may be greater than a thickness of the border portion 420 which extends out of the plane 441 and towards the pellicle frame 417.

Whilst the thin film portion 421 of the pellicle is described above as defining a plane 441 it will be appreciated that in practice the thin film portion 421 has some extent in the z-direction and thus the entire thin film portion 421 does not lie in a single plane. In general the plane which is defined by the thin film portion 421 may be considered to be the plane in which the surface of the thin film portion 421 which is closest to the front side FS of the patterning device MA lies.

Various embodiments have been described above in which a glue is used to attach a pellicle to a pellicle frame and/or a glue is used to attach a pellicle frame to a patterning device MA. As has been described above, gas may be released from glue by outgassing. The products of outgassing from a glue can disadvantageously contaminate a patterning device MA and in particular can contaminate a patterned area of a patterning device. Contamination of a patterned area of a patterning device MA may adversely affect a pattern which is transferred to a radiation beam B and thus a pattern which is transferred to a substrate W by the radiation beam B. It is therefore desirable to reduce any contamination of a patterning device MA due to the products of outgassing from a glue.

Figure 11:
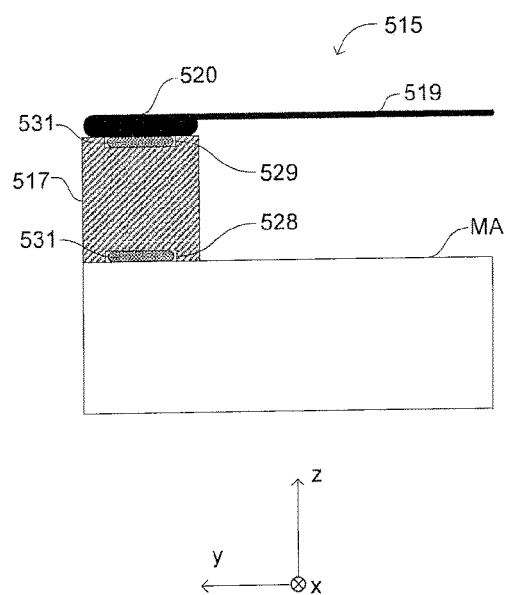
FIG. 11 is a schematic illustration of a portion of a pellicle frame according to an embodiment of the invention, a pellicle attached to the pellicle frame and a patterning device to which the pellicle frame is attached.

FIG. 11 is a schematic illustration of a portion of a mask assembly 515 which includes features configured to reduce contamination of a patterning device MA due to the products of outgassing from a glue. The mask assembly 515 includes a patterning device MA, a pellicle frame 517 and a pellicle 519. In the embodiment which is shown in FIG. 11, the pellicle 519 includes a border portion 520 having an increased thickness relative to the rest of the pellicle 519. However in other embodiments the pellicle 519 may not include a border portion or may include a border portion 520 which is arranged differently to the border portion 520 shown in FIG. 11 (e.g. the border portion may be arranged similarly to the border portion 420 which is shown in FIG. 10).

The pellicle 519 is attached to the pellicle frame 517 with glue 531 (which may also be referred to as adhesive) and the pellicle frame 517 is attached to the patterning device MA with glue 531. The pellicle frame 517 includes a first recess 529 configured to receive glue 531 for attachment of the pellicle 519 (in this case the pellicle border portion 520) to the pellicle frame 517. The first recess 529 is configured such that the attachment of the pellicle 519 to the pellicle frame 517 causes the glue 531 to be contained within a volume which is enclosed by the first recess 529 and the pellicle 519. Enclosing the glue 531 within a closed volume as is shown in FIG. 11 advantageously contains products of outgassing from the glue 531 within the closed volume, thereby reducing any contamination of the patterning device MA from products of outgassing from the glue 531. In another embodiment the recess may be partially open to allow for outgassing, with the opening being arranged such that any outgassing material is directed away from the patterned area of the patterning device MA (e.g. directed outwardly from the pellicle frame 517).

The pellicle frame 517 also includes a second recess 528 which is configured to receive glue 531 for attachment of the pellicle frame 517 to the patterning device MA. Similarly to the first recess 529, the second recess 528 is configured such that attachment of the pellicle frame 517 to the patterning device MA causes the glue 531 to be contained within a volume which is enclosed by the second recess 528 and the patterning device MA. Products of outgassing from the glue 531 are therefore advantageously contained within a closed volume thereby reducing any contamination of the patterning device MA from products of outgassing from the glue 531.

Whilst the first and second recesses which are shown in FIG. 11 contain the glue within a closed volume, in other embodiments the first and/or the second recesses may be open to the outside of the pellicle frame such that products of outgassing from the glue are released to the outside of the pellicle frame. The first and/or the second recesses may be configured such that the glue is sealed from a patterned area of the patterning device MA so as to prevent products of outgassing from the glue from reaching the patterned area of the patterning device MA thereby reducing any contamination of the patterned area of the patterning device MA.

The embodiment of a pellicle frame 517 which is shown in FIG. 11 includes a first recess 529 configured to receive glue 531 for attachment of a pellicle 519 to the pellicle frame 517 and second recess 528 configured to receive glue 531 for attachment of the pellicle frame 517 to the patterning device MA. However, in other embodiments the pellicle frame 517 may only include a single recess. In general a pellicle frame 517 may include a recess configured to receive a glue 531 for attachment of a pellicle 519 or a patterning device MA to the pellicle frame 517. The recess is configured such that attachment of a pellicle 519 or a patterning device MA to the pellicle frame 517 causes the glue 531 to be sealed from a patterned area of the patterning device MA. For example, the glue 532 may be contained within a volume enclosed by the recess and the pellicle 519 or patterning device MA.

In some embodiments a pellicle frame 517 may include a plurality of recesses. At least one of the plurality of recesses may be configured to receive a glue for attachment of a pellicle 519 to the pellicle frame 517 and at least one of the plurality of recesses may be configured to receive a glue for attachment of a patterning device MA to the pellicle frame 517.

Whilst a pellicle frame including one or more recesses has been described above with reference to specific embodiments of a pellicle frame, one or more recesses may be advantageously included in other embodiments of a pellicle frame such as the embodiments described throughout this document.

Figure 12:
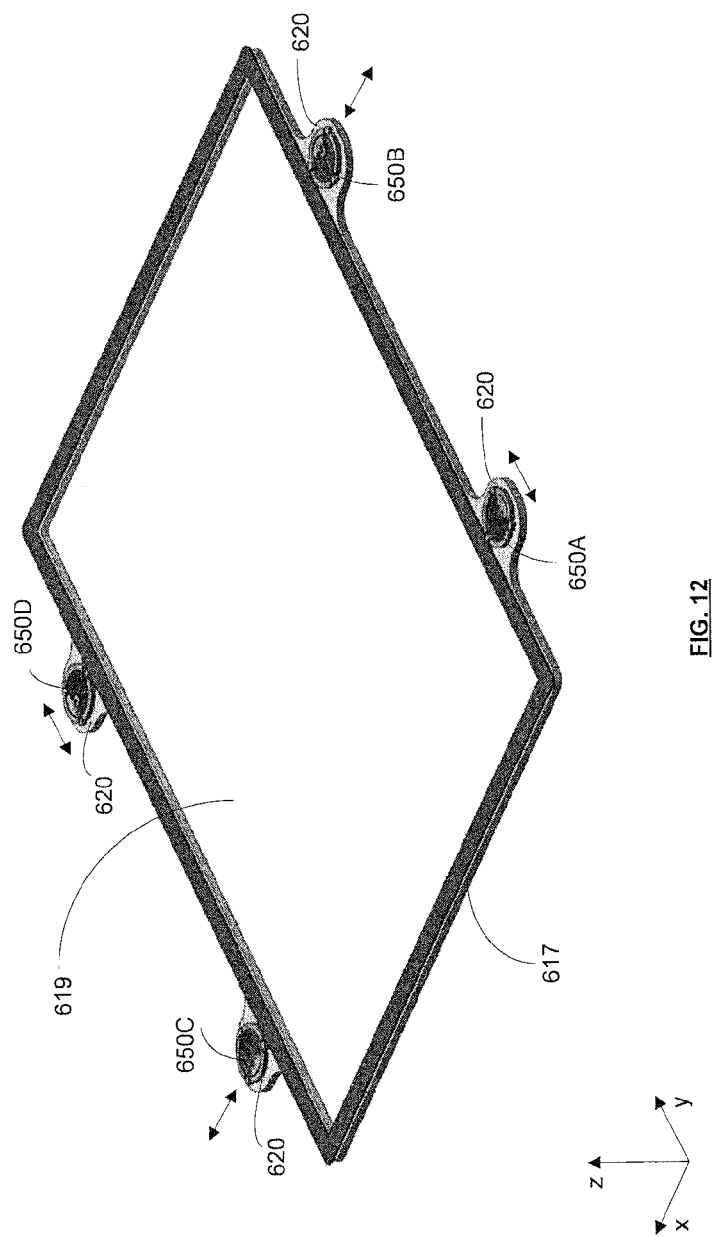
FIG. 12 shows a pellicle frame and pellicle according to an embodiment of the invention.

A mask assembly according to a further alternative embodiment of the invention is illustrated in FIGS. 12-14. In this embodiment a pellicle frame and pellicle are suspended relative to a patterning device (e.g. a mask). The pellicle frame is releasably engageable with the patterning device. The releasable engagement is provided by a mount which comprises a plurality of sub-mounts (for example 2, 3, 4 or even more sub-mounts) and allows the pellicle frame (and pellicle) to be removed from the patterning device in an easy and convenient manner. The removal of the pellicle frame and pellicle from the patterning device may be clean, i.e. may generate substantially no contamination particles. The pellicle frame and pellicle can subsequently be easily reattached to the patterning device or may be replaced with a new pellicle frame and pellicle.

Referring first to FIG. 12, a pellicle 619 is attached to a pellicle frame 617. The pellicle 619 may, for example, be glued to the pellicle frame 617. The pellicle frame 617 is provided with four engagement mechanisms 650A-D, each of which is configured to receive a protrusion (e.g. which may be referred to as a stud) which extends from a patterning device (as described below in connection with FIGS. 13 and 14). Two engagement mechanisms 650A, B are provided on one side of the pellicle frame 617 and two engagement mechanisms 650C, D are provided on an opposite side of the pellicle frame, although other attachment combinations may also be possible such as an engagement mechanism on each of the four frame sides etc. The engagement mechanisms are provided on sides of the pellicle frame 617 which will be oriented in the scanning direction during use in a lithographic apparatus (indicated in FIG. 12 as the y-direction in accordance with conventional notation). However, the engagement mechanisms may also be provided on sides of the pellicle frame 617 which will be oriented perpendicular to the scanning direction during use in a lithographic apparatus (indicated in FIG. 12 as the x-direction in accordance with conventional notation).

The protrusions may be located on the front surface of the patterning device. Additionally or alternatively, the protrusions may be located on sides of the patterning device. Protrusions may extend upwardly from sides of the patterning device. In such an arrangement the protrusions may each have a flattened lateral surface to facilitate secure bonding to a side of the patterning device.

Figure 13A:
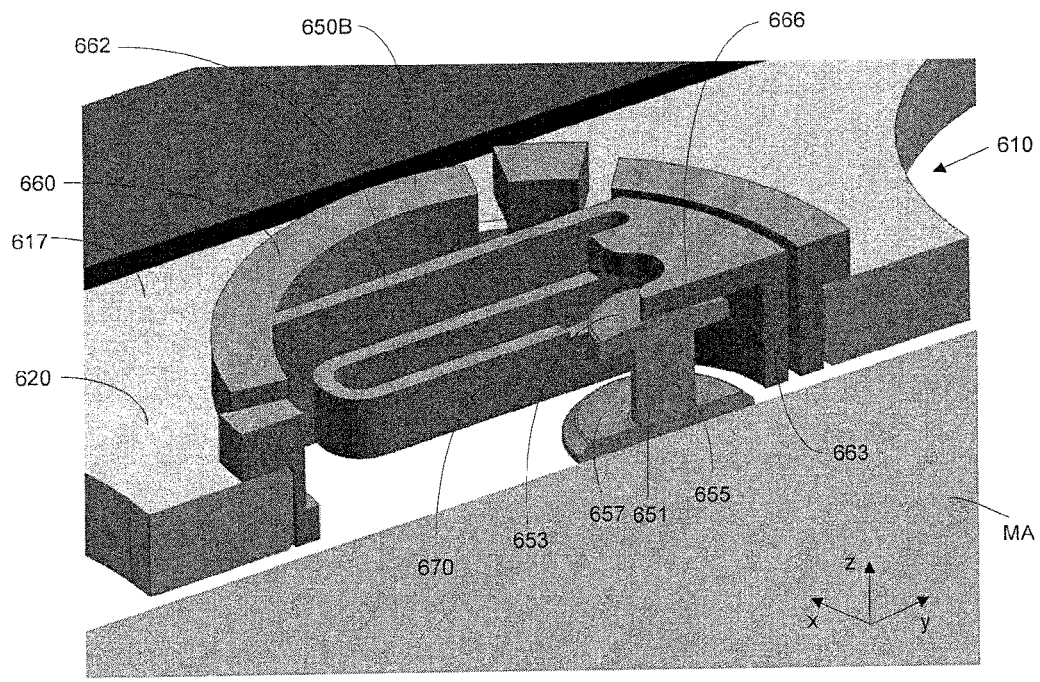
FIG. 13 is two cross-sectional views of an engagement mechanism of the pellicle frame of FIG. 12 attached to a mask.
Figure 13B:
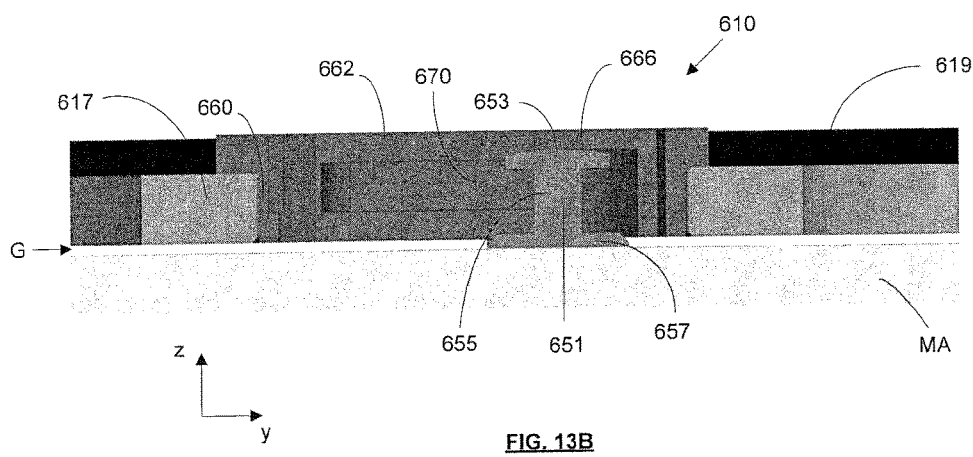

FIG. 13 depicts engagement of one engagement mechanism 650B with a protrusion 651 which projects from a patterning device MA. FIG. 13A is a cross-sectional perspective view, and FIG. 13B is a cross-sectional view from one side. The protrusion 651, which may be referred to as a stud, may for example be glued to the patterning device MA or may be attached by other bonding means (optical contacting, magnetic or van der Waals forces, etc). The engagement mechanism 650B and the protrusion 651 together form a sub-mount 610. The protrusion 651 comprises a distal head 653 located on a shaft 655 which extends from a base 657. The base 657 is fixed to the patterning device MA for example by using a glue or via a polymer film covalently bonded to the base 657 and attached to the patterning device MA via van der Waals forces. When bonding via polymer film is used the protrusion 651 may be peeled off the patterning device MA when desired (e.g. to allow cleaning of the patterning device without the protrusion being present). Although the illustrated shaft 655 and distal head 653 are cylindrical, they may have any suitable cross-sectional shape.

The engagement mechanism 650B has a (generally circular) outer wall 660 which is received in an opening (e.g. a circular hole) provided in the pellicle frame 617. Although in the figure the outer wall 660 and the opening are depicted as being circular, also other shapes are possible. The outer wall defines a space within which other components of the engagement mechanism 650B are provided. The circular hole which receives the outer wall 660 is provided in a tab 620 which projects from an outer edge of the frame (the tab 620 may be seen most clearly in FIG. 12). The engagement mechanism 650B may in other arrangements have an outer wall with any suitable shape, with a correspondingly shaped hole being provided in the pellicle frame 617 to receive the outer wall. The engagement mechanism 650B may be secured to the pellicle frame 617 using glue or any other kind of bonding.

A pair of arms 662 extend from the outer wall 660. The arms 662, only one of which his shown in FIG. 13, extend across the space defined by the outer wall 660 but are not connected to the opposite side of the outer wall. The arms 662 may be made for example from a resilient material, forming thus resilient arms 662. A connection 663 extends between distal ends of the arms 662. The arms 662 and the connection 663 together form a generally U-shaped support. The arms 662 of the illustrated engagement mechanism 650B extend in the y-direction. However, the arms may extend in some other direction. A locking member 670 is connected to a distal end of the generally U-shaped support. The locking member 670 engages with the protrusion 651 thereby securing the pellicle frame 617 to the patterning device MA. The locking member 670 is described further below with reference to FIG. 14. The arms 662 are examples of resilient members. Other resilient members may be used.

A cap 666 is provided at a distal end of the generally U-shaped support and is configured to extend at least partway over the distal head 653 of the protrusion 651 (as shown in FIG. 13). The cap 666 rests upon the distal head 653 of the protrusion, and limits movement of the pellicle frame 617 towards the patterning device MA. The cap is thus a movement limiting component which limits movement of the pellicle frame 617 in the z-direction. Other suitable movement limiting components may be used instead of a cap.

As may be most easily seen in FIG. 13B, the sub-mount 610 suspends the pellicle frame 617 relative to the patterning device MA such that there is a gap G (which may be considered to be a slit) between the pellicle frame and the patterning device. The gap G may be maintained by engagement between the cap 666 and the distal head 653 of the protrusion 651 (or by some other movement limiting component). The gap G may be sufficiently wide to allow equalization of pressure between the exterior environment and the space between the pellicle and the patterning device. The gap G may also be sufficiently narrow that it provides a desired restriction of the potential route of contamination particles from the exterior environment to the space between the pellicle and the patterning device.

The gap G may for example be at least 100 microns in order to allow equalization of pressure between the exterior environment and the space between the pellicle and the patterning device. The gap G may for example be less than 500 microns, more preferably less than 300 microns. The gap G may for example be between 200 microns and 300 microns. The gap G may for example have a maximum size of 250 microns (which may provide a desired level of restriction to the potential route of contamination particles from the exterior environment to the space between the pellicle and patterning device. The gap G may have the size around the perimeter of the pellicle frame. Alternatively, the gap G may have a size which varies around the perimeter of the pellicle frame, for example some portions having a size of around 100 microns and other portions having a size of around 250 microns. In an embodiment the gap may have a smaller at locations where it is more likely that contamination particles are generated or transported towards the patterned area of the patterning device. An example of such locations is the positions where the pellicle frame 617 is connected to the patterning device MA (e.g. at the sub-mounts 610).

Figure 14A:
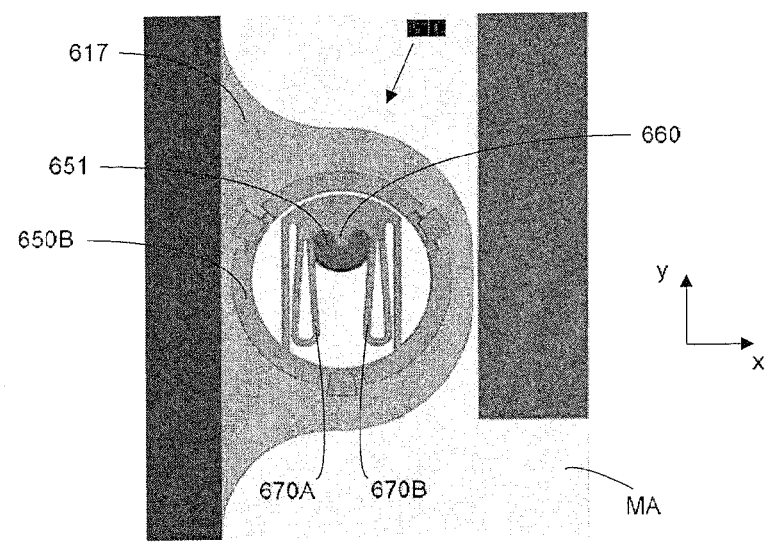
FIG. 14 shows the engagement mechanism and mask viewed from above.
Figure 14B:
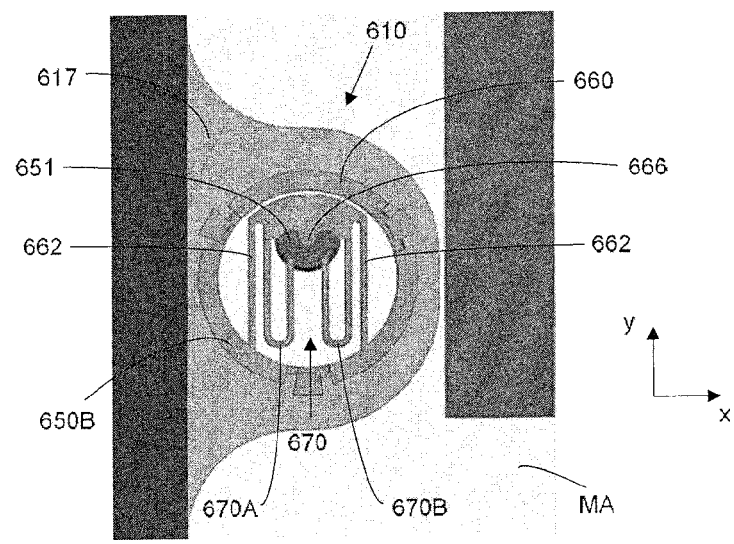

FIGS. 14A and 14B show the sub-mount 610 viewed from above, and illustrate the manner in which the protrusion 651 engages with the engagement mechanism 650B. Referring first to FIG. 14A, the locking member 670 of the engagement mechanism 650B comprises a pair of U-shaped members 670A, B. The U-shaped members project from the distal end of the generally U-shaped support. The U-shaped members each have one end which is connected to the generally U-shaped support and an opposite end which is unsecured. Each U-shaped member 670A, B is moveable in the x-direction, as may be seen by comparing FIGS. 14A and 14B, with the unsecured ends being capable of the greatest amount of movement. The engagement mechanism 650B is formed from a material which has some resilience (e.g. steel or some other metal, or plastic) and thus if the unsecured ends of the U-shaped members 670A, B are moved in the x-direction by a force, they will return to their original positions when that force is no longer being applied.

To secure a pellicle frame 617 to a patterning device MA the pellicle frame is positioned relative to the patterning device such that the protrusions 651 are aligned with the engagement mechanisms 650A-D. The pellicle frame 617 is then moved towards the patterning device MA (or vice versa). The distal head 653 of the protrusion 651 has a rounded upper surface which pushes the unsecured ends of the U-shaped members 670A, B apart. The U-shaped members thus move outwardly until they pass over the distal head 653 of the protrusion 651 as depicted in FIG. 14A.

The resilient nature of the U-shaped members 670A, B causes them to move back towards their original positions, i.e. move inwardly to the positions shown in FIG. 14B, once they have passed over the distal head 653. Thus, the unsecured ends of the U-shaped members move to beneath the head 653 of the protrusion 651. The underneath of the distal head 653 has a flat surface rather than a curved surface. As a result, applying a force which pulls the pellicle frame 617 away from the patterning device MA will not cause outward movement of the unsecured ends of the U-shaped members 670A, B. The U-shaped members thus remain in place beneath the distal head 653 of the protrusion, and the pellicle frame 617 is securely attached to the patterning device MA.

Although the above description explains how the U-shaped members 670A, B automatically engages the distal head 653 when the pellicle frame 617 is moved towards the patterning device MA, in an alternative approach the U-shaped members may be manipulated (e.g. manually or using an automated probe) to engage the distal head. In such an approach the U-shaped members 670A, B are pushed apart (e.g. using a probe) and are pushed downwards such that they are pushed past the distal head 653. The U-shaped members are then moved towards each other and pulled upwards such that they engage the protrusion 651 beneath the distal head 653. This may be done actively (e.g. using a probe) or passively by allowing the resilience of the U-shaped members to generate this movement. The pellicle frame 617 is thereby drawn towards and engaged with the patterning device MA. A benefit of this approach, compared with the approach described further above, is that is avoids rubbing of the U-shaped members 670A, B on the distal head 653 which might generate unwanted contamination particles.

If it is desired to remove the pellicle frame 617 from the patterning device MA, then this may be achieved by using a probe or other suitable member to push apart the unsecured ends of the U-shaped members 670A, B to the positions shown in FIG. 14A. This releases the engagement mechanism 650B from the protrusion 651 and allows the pellicle frame 617 to be removed from the patterning device MA. Releasing the engagement mechanism 650B from the protrusion 651 in this manner may avoid producing particle debris via rubbing between surfaces (this may be referred to as clean removal).

Each engagement mechanism 650A-D, when engaged with a protrusion 651, forms a sub-mount 610 which suspends the pellicle frame 617 from the patterning device MA (and thereby provides the gap G). These sub-mounts 610, taken together, form a mount which suspends the pellicle frame 617 from the patterning device MA. The mount is configured to restrain movement of the pellicle frame 617 as a whole to substantially prevent rotation or translation of the pellicle frame relative to the patterning device MA. Each sub-mount 610 is configured to restrain movement of the pellicle frame 617 relative to the patterning device MA at the position of that sub-mount to a limited number of degrees of freedom (i.e. movement in one direction is prevented at that sub-mount). Although movement in one direction is prevent by each sub-mount, movement in other directions is permitted. As a result, the sub-mounts together form a kinematic mount arrangement which allows for expansion and contraction of the pellicle frame 617 without causing significant bending of the patterning device MA. This is explained in more detail below.

Double headed arrows are used in FIG. 12 to indicate a direction of movement which is permitted by each engagement mechanism 650A-D. In FIG. 12 a first engagement mechanism 650A allows movement of the pellicle frame 617 relative to the patterning device in the y-direction but prevents movement in the x-direction. The second engagement mechanism 650B allows movement in the x-direction but does not allow movement in the y-direction. Thus, one side of the pellicle frame 617 is provided with an engagement mechanism which allows movement in the x-direction and an engagement mechanism which allows movement in the y-direction. On the opposite side of the pellicle frame 617 a third engagement mechanism 650C allows movement in the x-direction but prevents movement in the y-direction, and a fourth engagement mechanism 650D allows movement in the y-direction but prevents movement in the x-direction.

As mentioned above, each engagement mechanism when engaged with a protrusion 651 forms a sub-mount 610. The sub-mounts 610 may be referred to as kinematic sub-mounts. The kinematic sub-mounts 610 together form a kinematic mount arrangement Each sub-mount 610 allows some movement of the pellicle frame 617 relative to the patterning device at the position of that sub-mount. Thus, localized movement of the pellicle frame 617, e.g. due to expansion or contraction, may take place without force being exerted on the patterning device MA which is sufficiently strong to cause significant warping of the patterning device. If rigid connections with no resilience were to be provided between the pellicle frame 617 and the patterning device MA then expansion or contraction of the pellicle frame would be liable to cause warping of the patterning device. The kinematic nature of the sub-mounts 650A-D substantially prevents such warping from occurring.

Sub-mounts provided at equivalent positions on opposite sides of the pellicle frame 617 are complementary pairs. Each complementary pair allows some localized movement of the pellicle frame 617 relative to the patterning device MA in the x and y directions but prevents movement of the whole of one end of the pellicle frame 617. For example, the sub-mounts which comprise the first and third engagement mechanisms 650A, C allow localized movement of the pellicle frame 617 but prevent movement of the whole of the left-hand end of the pellicle frame. That is, the left-hand end of the pellicle frame 617 is prevented from moving in the x-direction (and the y-direction) relative to the patterning device MA. The sub-mounts which comprise the second and fourth engagement mechanisms 650B, D similarly allow localized movement of the pellicle frame 617 but prevent movement of the whole of the right-hand end of the pellicle frame. That is, the right-hand end of the pellicle frame 617 is prevented for example from moving in the x-direction (and the y-direction) relative to the patterning device MA.

The manner in which each sub-mount 610 allows movement in one direction but prevents movement in another direction may be best understood with reference to FIG. 14B. In FIG. 14B the arms 662 of the engagement mechanism 650B which support the locking member 670 (formed by U-shaped members 670A, B) extend in the y-direction. As noted above, the engagement mechanism 650B is formed from resilient material. Since the arms 662 extend in the y-direction and are resilient, some bending of the arms in the x-direction is possible. This allows movement in the x-direction of the locking member 670 relative to the outer wall 660 of the engagement mechanism 650B. However, because the arms extend in the y-direction no equivalent movement of the locking member 670 in the y-direction is possible.

The orientation of the arms 662 of each engagement mechanism 650A-D will determine in which direction movement is permitted and in which direction movement is prevented. Although FIG. 12 shows a particular combination of orientations of engagement mechanism 650A-D, other orientations may be used. The orientations can be in any direction, and may be selected to provide kinematic coupling which reduces potential deformation of the patterning device MA whilst limiting dynamic movement of the pellicle frame 617.

Although FIGS. 12-14 illustrate a kinematic mount arrangement which comprises a particular form of sub-mount 610, other suitable kinematic mount arrangements may be used. Kinematic sub-mounts may have any suitable form.

Figure 15A:
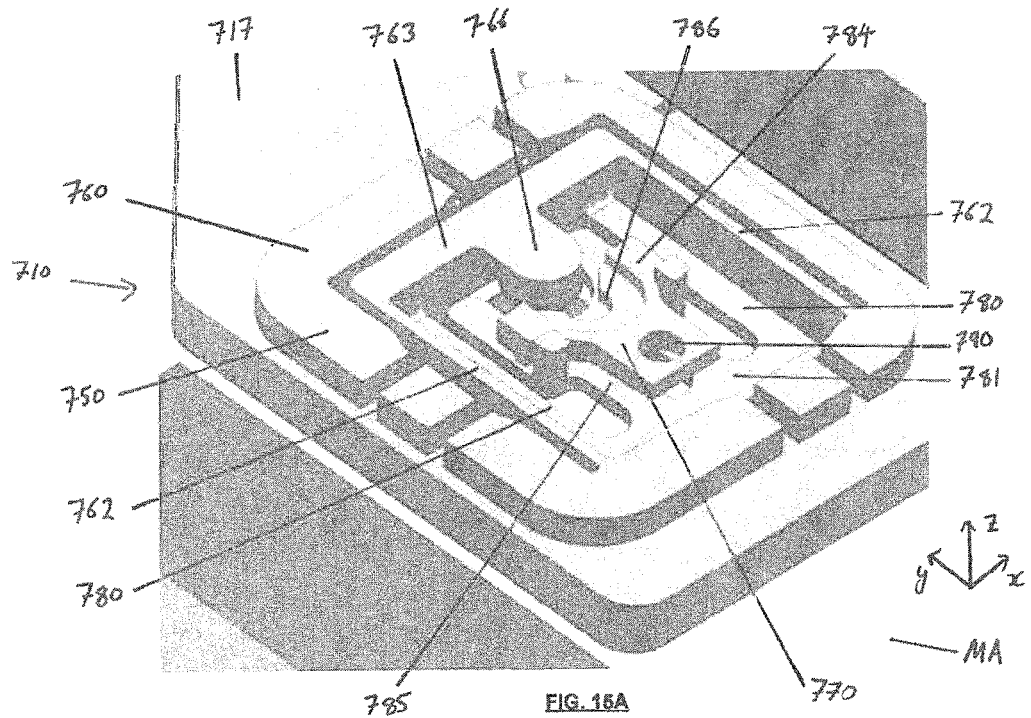
FIG. 15 is two perspective views of an engagement mechanism and mask according to an alternative embodiment.
Figure 15B:
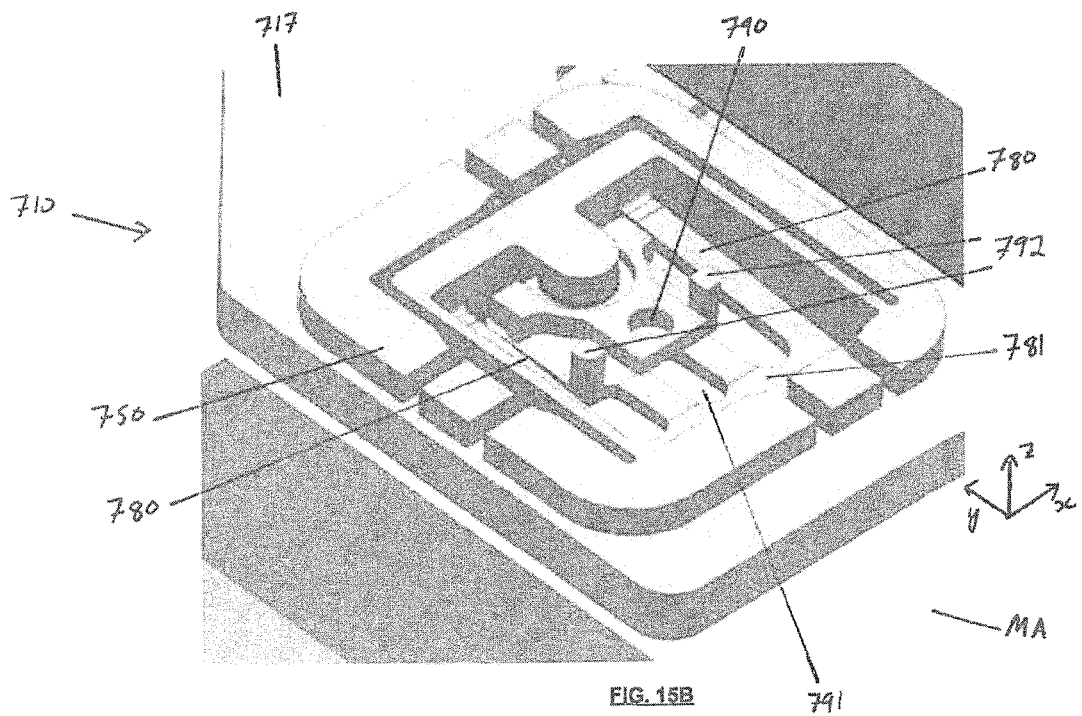
Figure 16:
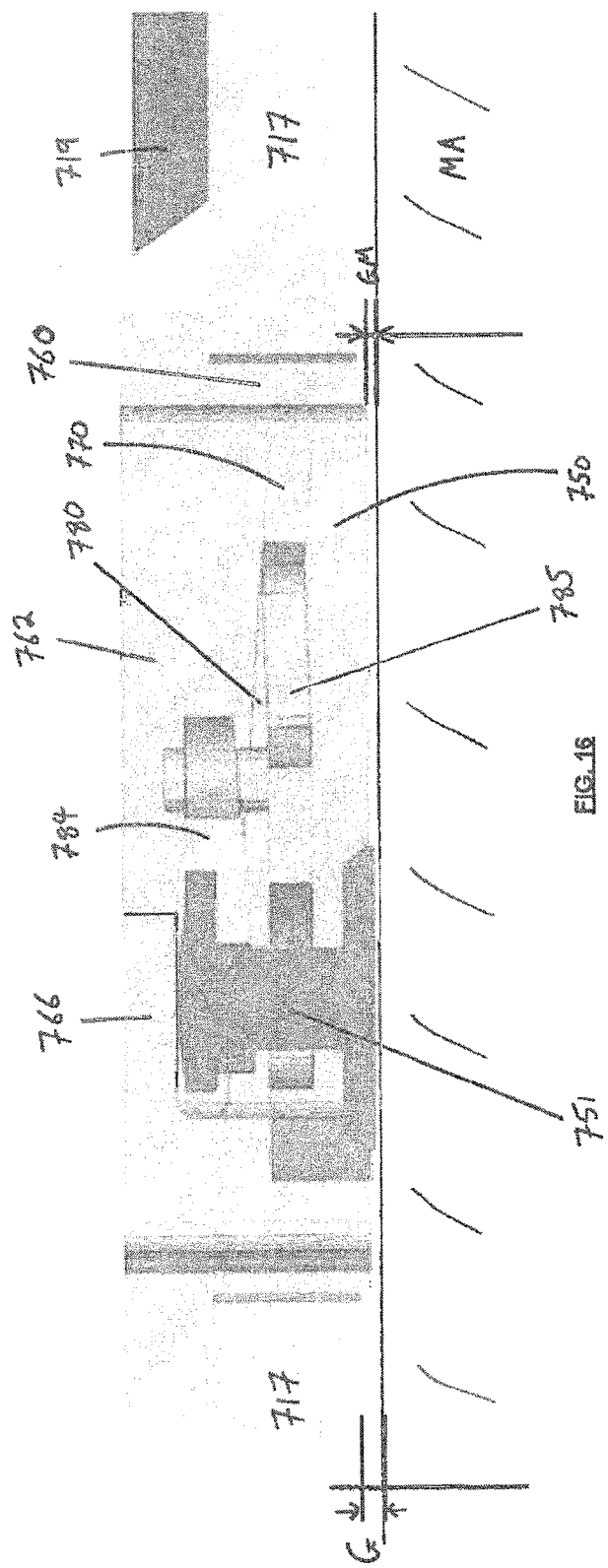
FIG. 16 is a cross-sectional view of the engagement mechanism and mask of FIG. 15.

FIG. 15 illustrates a sub-mount 710 according to an alternative embodiment of the invention. FIG. 16 shows the sub-mount 710 in cross-section. The sub-mount includes several features which are common with the sub-mount illustrated in FIGS. 12-14 and these are not described in detail in relation to FIGS. 15 and 16. However, the sub-mount 710 differs from the sub-mount shown in FIGS. 12-14. For example, the sub-mount 710 has a generally rectangular outer wall 760 and includes a different locking member 770. FIG. 15A shows the sub-mount in an unlocked configuration (i.e. the pellicle frame 717 may be lifted away from the patterning device MA) and FIG. 15B shows the sub-mount in a locked configuration (i.e. the pellicle frame 717 cannot be lifted away from the patterning device MA, but instead is held in place). In common with other Figures, Cartesian coordinates are indicated in order to facilitate description of the embodiment. In accordance with conventional notification, the y-direction corresponds with the scanning direction of the patterning device MA in a lithographic apparatus.

The engagement mechanism 750 shown in FIG. 15 comprises a rectangular outer wall 760 which is received in rectangular hole in the pellicle frame 717. A pair of arms 762 extend in the y-direction across a space defined by the outer wall 760. A connection 763 extends between distal ends of the arms 762. The arms 762 are examples of resilient members. Other resilient members may be used. The arms 762 and connection 763 together form a generally U-shaped support. Although the arms 760 of the illustrated engagement mechanism extend in the y-direction, arms of other engagement mechanisms may extend in other directions (e.g. in a configuration which corresponds with that depicted in FIG. 12). A locking member 770 is connected to a distal end of the generally U-shaped support. The locking member 770 engages with a protrusion 751 (which may be referred to as a stud) thereby securing the pellicle frame 717 to the patterning device MA (as shown in FIG. 16). The protrusion 751 may correspond with the protrusion 651 illustrated in FIGS. 13 and 14.

A cap 766 is provided at a distal end of the generally U-shaped support and is configured to extend at least partway over a distal head of the protrusion 751. This limits movement of the pellicle frame 717 towards the patterning device MA. The cap 766 maintains a gap G (see FIG. 16) between the pellicle frame 717 and the patterning device MA.

The locking member 770, in common with the locking member described above in connection with FIG. 14, comprises a pair of arms which extend from the distal end of the U-shaped member. However, in the embodiment depicted in FIG. 15, the arms 780 are connected at a distal end by a connecting member 781. A locking plate 784 is supported by a support 785 which extends from the connecting member 781. The locking plate 784 is movable in the y-direction from a position in which it is separated from the protrusion 751 to a position at which it engages with the protrusion 751.

The arms 780 and support 785 provide a degree of movement in the z-direction and thus act as a spring. This allows some movement in the z-direction of the locking plate 784. In FIG. 15A no force has been applied in the z-direction and the arms 780 and support 785 are thus substantially parallel to the plane of the patterning device MA. When no downward force is being applied against the arms 780 and support 785, a shaft-receiving recess 786 of the locking plate 784 is not aligned with the shaft of the protrusion 751 and thus cannot engage with the protrusion.

When downward force is applied to the locking plate 784 the arms 780 and support 785 bend downwards. As a result of this bending of the arms 780 and support 785, the locking plate 784 is aligned with the shaft of the protrusion 751. The locking plate 784 can then be moved in the y-direction such that the shaft is received in a shaft-receiving recess 786 of the locking plate. The downward force being applied to the locking plate 784 is then removed, whereupon the resilience of the arms 780 and the support 785 pushes the locking plate 784 upwards against the distal head of the protrusion 751. This force helps to hold the locking plate 784 in place. The engagement mechanism 760 is thus locked in place in the configuration shown in FIG. 15B.

A pair of posts 792 project upwardly from the support 785. The posts 792 limit movement in the y-direction away from the protrusion 751, thereby preventing excess movement in the y-direction of the locking plate 784.

From FIG. 16 it can be seen that the outer wall 760 of the engagement mechanism 750 projects below the bottom of the pellicle frame 717. From a comparison of FIG. 16 with FIG. 13B it can be seen that this is a difference compared with the previously described embodiment, in that in FIG. 13B the outer wall 660 is substantially flush with the bottom surface of the pellicle frame 717. In the embodiment shown in FIG. 16 a gap G between the pellicle frame 717 and the patterning device MA may correspond with the gap described above in connection with the previous embodiment. However, a gap GM between the engagement mechanism 750 and the patterning device MA may be significantly smaller (e.g. around 100 μm). The gap GM between the engagement mechanism 750 and the patterning device MA is a small fraction of the perimeter around the pellicle frame 717, and thus does not have a significant influence upon the flow of gas into and out of the space between the pellicle 719 and the patterning device MA. The smaller gap GM (compared with the gap G between the pellicle frame 717 and the patterning device MA) is advantageous because it reduces the likelihood of a contamination particle generated by the engagement mechanism passing into the space between the pellicle (not shown in FIG. 16) and the patterning device MA. Although the engagement mechanism 750 may be designed to avoid generation of contamination particles, some releasable engagement between surfaces of the engagement mechanism is required in order to secure the pellicle frame 717 to the patterning device MA, and as a result of this engagement it is possible that some contamination particles will be generated. Providing a smaller gap GM in the vicinity of the engagement mechanism 750 reduces the likelihood of such a contamination particle reaching a patterned area of the patterning device MA.

Although the embodiment depicted in FIGS. 12-14 does not have a smaller gap GM in the vicinity of the locking members 650A-D, a smaller gap may be provided by modifying the locking members such that they protrude beyond the bottom surface of the pellicle frame 617. In general, in an embodiment in which a gap is provided between a pellicle frame and a patterning device, the gap may be smaller in the vicinity of a sub-mount than the gap at other locations. The gap in the vicinity of the sub-mount may for example be less than 200 μm, and may for example be around 100 μm or less.

Because the locking member 770 is connected to distal ends of the arms 762, some movement transverse to the direction of the arms is possible. Thus, some movement in the x-direction of the reticle frame 717 relative to the patterning device MA at the position of the sub-mount shown in FIG. 15 is possible. The arms 762 are formed from resilient material (e.g. metal such as steel) and will therefore tend to return to their original orientations. The sub-mount 710 may be considered to be a kinematic sub-mount. The arms 762 are significantly thicker in the z-direction than in the x-direction, and as a result significantly less bending of the arms in the z-direction is possible compared with bending of the arms in the x-direction. The arms 762 may thus prevent or substantially prevent local movement of the reticle frame 717 in the y- and z-directions whilst allowing movement in the x-direction.

The locking plate 784 is provided with a hole 790 which allows a probe to engage with the locking plate and move the locking plate. The probe may be manually operated or may be operated in an automated manner by an actuator. The probe is received in the hole 790 and used to push the locking member 770 downwards (as depicted in FIG. 16).

The probe then slides the locking plate 784 in the y-direction to engage with the protrusion 751. The probe is then removed from the hole 790.

An advantage of the engagement mechanism 750 shown in FIGS. 15 and 16 compared with the engagement mechanism shown in FIGS. 12 to 14 it is easier to engage with a protrusion. The engagement mechanism of FIGS. 12 to 14 comprises U-shaped members 670A, B which are pushed apart and downwards to achieve engagement of the protrusion, which is a relatively difficult form of motion to achieve (e.g. using an automatically actuated probe). The engagement mechanism of FIGS. 15 and 16 merely requires pushing the sliding plate 784 downwards and then sliding the locking plate towards the protrusion. A further advantage is that the engagement mechanism of FIGS. 15 and 16 includes a resilient bias only in the vertical direction when it is engaged with a protrusion, whereas the engagement mechanism may also include a resilient bias in the horizontal direction when it is engaged with a protrusion. Furthermore, the kinematic movement provided by the engagement mechanism of FIGS. 15 and 16 (e.g. in the x-direction in FIG. 15) is in a direction which is substantially perpendicular to the resilient bias used to maintain engagement between the locking plate 784 and the protrusion. This decoupling of kinematic movement from the engagement resilient bias is not provided by the embodiment shown in FIGS. 12 to 14, in which resilient bias and kinematic movement are in the same direction (e.g. the x-direction in FIG. 14). Other configurations of engagement mechanism may be used to decouple kinematic movement from an engagement resilient bias.

A kinematic mount arrangement (e.g. comprising a plurality of kinematic sub-mounts) may substantially prevent the pellicle frame 617, 717 as a whole from undergoing rotation or translation relative to the patterning device MA. The kinematic mount arrangement may allow localized expansion and contraction of the pellicle frame without causing warping of the patterning device MA. In other words, significant bending of the patterning device MA is avoided. The term "significant bending" may be understood as an amount of bending which would have a noticeable effect upon the accuracy of a pattern projected onto a substrate (e.g. such that the pattern is not sufficiently accurate to allow correct functioning of an integrated circuit formed using the pattern).

The resilient arms 662, 762 of the embodiments described in relation to FIGS. 12 to 16 are examples of resilient components which connect the pellicle frame 617, 717 to the patterning device MA. Other suitable types of resilient component may be used.

In the embodiments depicted in FIGS. 12 to 16 the protrusion 651, 751 is provided on the patterning device MA and the engagement mechanism 650, 750 is provided on the pellicle frame 617, 717. However, this arrangement may be reversed, with the protrusion being provided on the pellicle frame and the engagement mechanism being provided on the patterning device.

A pellicle frame according to an embodiment of the invention may, for example, be formed from silicon. The pellicle frame may be exposed to hydrogen radicals and stray EUV radiation during use. These may dissolve the surface of the frame and cause undesirable outgassing. A capping layer may be provided on the pellicle frame to prevent or reduce such outgassing. The capping layer may, for example, be SiOx, SiN, ZrO or other EUV-proof oxides.

In an embodiment the pellicle frame and the pellicle may be formed from the same material (e.g. polysilicon). An advantage of forming the pellicle frame and the pellicle from the same material is that both have the same coefficient of thermal expansion and thus can be expected to behave in the same manner when they receive heat from a EUV radiation beam. Thus bending of the type that is seen in a bimetallic strip is avoided.

In an embodiment the pellicle frame and the pellicle may be formed from different materials which have the same coefficient of thermal expansion. This provides the same advantage. An example of such materials is polysilicon and thermally matched glass (i.e. glass which has a coefficient of thermal expansion which is matched to that of the polysilicon).

Gluing of the pellicle to the pellicle frame may be achieved in any suitable manner. In an embodiment, substantially U-shaped (or V-shaped) recesses may be distributed around the pellicle frame. Each recess is shaped to extend from an outer edge of the pellicle frame partway to an inner edge of the pellicle frame and back to the outer edge of the pellicle frame. The recesses connect to the outer edge of the pellicle frame but do not connect to the inner edge of the pellicle frame. The recesses thus each define an island in the surface of the pellicle frame.

The pellicle may be held against the pellicle frame, and glue may be introduced into ends of the recess at the outer edge of the pellicle frame. The glue will be drawn in to the recesses by capillary action and will secure the pellicle to the pellicle frame. Because the recesses do not connect to the inner edge of the pellicle frame, the glue is prevented from travelling to the inner edge of the pellicle frame and is thereby prevented from directly entering the space between the pellicle and the patterning device. Although some outgassing of the glue may occur over time, the outgassing will exit from the outer edge of the pellicle frame and thus will not cause significant contamination in the space between the pellicle and the patterning device.

In general, a recess in which glue is provided between the pellicle border and the pellicle frame may be configured open towards an outer surface of the pellicle frame. This ensures that outgassing from the recess is directed away from the patterned area of the patterning device. In general, a recess in which glue is provided between the pellicle border and the pellicle frame may be configured to not open towards an inner surface of the pellicle frame. This ensures that outgassing from the recess is not directed towards the patterned area of the patterning device. The same approach may be used when configuring a recess used to glue a protrusion (which may also be referred to as a stud) to the patterning device.

The sub-mount positions shown in FIG. 12 are merely an embodiment, and sub-mounts may be provided in other positions. Similarly, other numbers of sub-mounts may be provided. For example, three sub-mounts may be provided in an arrangement which corresponds with that shown in FIG. 5.

It will be appreciated from the description of various embodiments of mask assemblies which is provided above, that a mask assembly may be prepared for use in a lithographic apparatus by attaching a pellicle to a pellicle frame and by attaching the pellicle frame to a patterning device. A mask assembly comprising a patterning device MA and a pellicle supported adjacent to the patterning device by a pellicle frame may be prepared separate from a lithographic apparatus LA and the mask assembly may be transported to the lithographic apparatus LA for use in the lithographic apparatus LA. For example, a pellicle frame supporting a pellicle may be attached to a patterning device, so as to form a mask assembly, at a site at which a pattern is imparted onto the patterning device. The mask assembly may then be transported to a separate site at which a lithographic apparatus LA is situated and the mask assembly may be provided to the lithographic apparatus LA for use in the lithographic apparatus LA.

A mask assembly in which a pellicle is held in place by a pellicle frame may be delicate and transport of the mask assembly may risk damage to the pellicle. Assembling a mask assembly in a separate environment to a lithographic apparatus LA may additionally result in the mask assembly being exposed to a variety of pressure conditions. For example, a mask assembly may be transported to a lithographic apparatus under ambient pressure conditions. The mask assembly may then be loaded into the lithographic apparatus LA via a load lock which is pumped to vacuum pressure conditions. As was described above changes in the pressure conditions to which a mask assembly is exposed may cause a pressure difference to exist across a pellicle which may cause the pellicle to bend and may risk damage to the pellicle.

Figure 17:
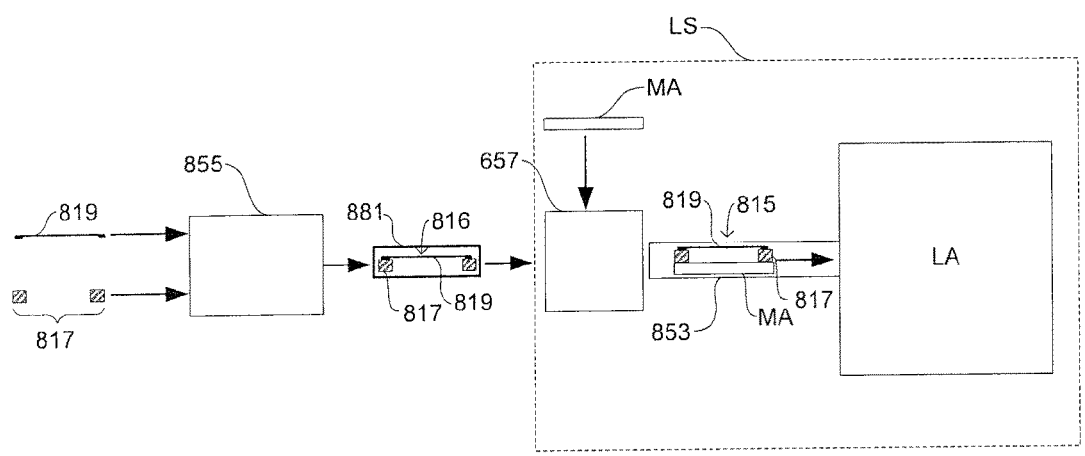
FIG. 17 is a schematic illustration of a pellicle attachment apparatus and a lithographic system according to embodiments of the invention.

FIG. 17 is a schematic illustration of apparatus suitable for assembling a mask assembly. The apparatus which is depicted in FIG. 17 includes a lithographic system LS and a pellicle attachment apparatus 855. The lithographic system LS comprises a pellicle frame attachment apparatus 657, a lithographic apparatus LA and a mask assembly transport device 853. The lithographic system LS may, for example, be situated at a different site to a site at which the pellicle attachment apparatus 855 is situated.

The pellicle attachment apparatus 855 receives a pellicle 819 and a pellicle frame 817. The pellicle attachment apparatus 855 is configured to attach the pellicle 819 to the pellicle frame 817 so as to provide a pellicle assembly 816. The pellicle attachment apparatus 855 may include a sealed environment in which the pellicle 819 is attached to the pellicle frame 817. The sealed environment may be maintained as a clean environment so as to reduce the number of particles inside the sealed environment, thereby reducing the number or particles which may be deposited on the pellicle 819. The sealed environment may, for example, be pumped so as to maintain a vacuum in the sealed environment. The pellicle attachment apparatus 855 may, for example, be situated at a site at which pellicles are manufactured. In some embodiments a pellicle 819 may be provided to the pellicle attachment apparatus 855 directly from a pellicle manufacturing tool (not shown) in which the pellicle 819 is manufactured. A pellicle 819 may, for example, be provided to the pellicle attachment apparatus 855 from a pellicle manufacturing tool whilst keeping the pellicle 819 inside a sealed and clean environment. This may reduce the chance of a pellicle 819 from being contaminated or damaged before being provided to the pellicle attachment apparatus 855.

In some embodiments the pellicle attachment apparatus 855 may include a particle inspection tool (not shown). The particle inspection tool may be configured to inspect a pellicle 819 and/or a pellicle frame 817 for particles disposed on the pellicle 819 and/or the pellicle frame 817. The particle inspection tool may, for example, reject pellicles 819 and/or pellicle frames 817 which have a number of particles disposed on them which is greater than a given particle threshold.

The attachment of the pellicle 819 to the pellicle frame 817 may be controlled so as to achieve a desirable tension in the pellicle 819. For example, the tension in the pellicle 819 may be measured during or after attachment of the pellicle 819 to the pellicle frame 817 and the tension may be adjusted in response to the measurement in order to achieve a desirable tension in the pellicle 819. The tension in the pellicle 819 may be maintained, for example, by applying an outward force to components of the pellicle frame 817 so as stretch the pellicle 819.

The pellicle attachment apparatus 855 is configured to seal the pellicle assembly 816 in a sealed packaging 881. The sealed packaging 881 allows the pellicle assembly to be transported without the pellicle assembly 816 being contaminated. The pellicle assembly 816 may be transported in the sealed packaging 881 to a lithographic system LS.

The pellicle assembly 816 in the sealed packaging 881 is received by the pellicle frame attachment device 657 which forms part of the lithographic system LS. The pellicle frame attachment device 657 may be configured to receive the pellicle assembly 816 and remove the pellicle assembly 816 from its packaging 881.

The pellicle frame attachment apparatus 657 further receives a patterning device MA. The patterning device MA may, for example, be transported to the pellicle frame attachment apparatus 657 from a separate site at which the patterning device MA is manufactured. The patterning device MA may be transported whilst being held in a clean environment. For example, the patterning device MA may be transported in a pod (not shown) which is sealed from the environment so as to maintain a clean environment inside the pod. In some embodiments the patterning device MA may be cleaned by the pellicle frame attachment apparatus 657, for example, to remove particles from the patterning device MA.

The pellicle frame attachment apparatus 657 is configured to attach the pellicle frame 817 of the pellicle assembly 816 to the patterning device MA so as to form a mask assembly 815. The pellicle frame attachment apparatus 657 may include a sealed environment in which the pellicle frame 817 is attached to the patterning device. The sealed environment may be maintained as a clean environment so as to reduce the number of particles inside the sealed environment, thereby reducing the number of particles which may be deposited on the mask assembly 815. The sealed environment may, for example, be pumped so as to maintain a vacuum in the sealed environment. In such embodiments, the mask assembly 815 may, for example, be loaded into the pellicle frame attachment apparatus via a load lock.

The patterning device MA may, for example, be provided with alignment marks. The pellicle frame 817 may be positioned relative to the alignment marks on the patterning device. Aligning the pellicle frame 817 relative to alignment marks on the patterning device may advantageously increase the accuracy with which the pellicle frame 817 is positioned on the patterning device MA during attachment of the pellicle frame 817 to the patterning device MA.

In an embodiment, the patterning device (mask) MA may be provided with protrusions which are received by engagement mechanisms (e.g. as described above in connection with FIGS. 12-16).

The protrusions may be provided by a protrusion attachment tool in order to be bonded onto the patterning device. The protrusion attachment tool may include an automatized protrusion manipulator, such as a robot. The protrusion attachment tool may also include a device for providing automatically a given amount of glue or adhesive to the protrusion surface to be attached to the patterning device (although applying an adhesive may also be done manually in advance).

The protrusion attachment tool may further include an optical alignment system which aligns the protrusion with respect to the alignment markers present on the reticle in order to accurately position the protrusion in the various assembly steps. For example, the alignment markers standardly available on the patterning device and used for the pattern alignment may be used also for aligning and providing the protrusions accurately. In addition, the same (or a further, separate optical alignment system) may be used to align the pellicle frame engagement mechanisms to the corresponding protrusions such that actuation of the engagement mechanism with the protrusions may be done without release of debris particles.

The protrusion attachment tool may include a patterning device table movable in the X-Y and Z directions for adjusting the position of the patterning device. The position of the patterning device may be adjustable by means of coarse and fine mechanical adjusting devices, via actuators or any other type of devices suitable for alignment and positioning which are coupled to the patterning device table.

In an embodiment the patterning device is provided to a protrusion attachment tool on an EIP based cover (a cover plate). An EIP based cover may be useful to reduce contamination risk during tooling use, i.e. for the prevention of contamination of an uncovered reticle during the attachment of the protrusions, at the pellicle frame placement or at any other process steps. In a further embodiment the patterning device table comprises a housing for receiving an EIP based cover suitable for holding a patterning device, such that after mounting the protrusions on the patterning device (by using the protrusion attachment tool described above) the patterning device may be immediately protected with a further cover. The patterning device having the protrusions mounted may be then provided to the pellicle frame attachment apparatus.

Although illustrated embodiments show the pellicle frame being attached at the front of the mask, in other embodiments the pellicle frame may be attached at other parts of the mask. For example, the pellicle frame may be attached to sides of the mask. This may be achieved for example using sub-mounts which provide releasably engageable attachment between the pellicle frame and sides of the mask. In an alternative arrangement the pellicle frame may be attached to the mask through a combination of some attachment locations on sides of the mask and some attachment locations on the front of the mask. Attachment may for example be provided by sub-mounts which releasably engage the pellicle frame and the mask.

In some embodiments the pellicle frame attachment apparatus 657 may include a particle inspection tool (not shown). The particle inspection tool may be configured to inspect the mask assembly 815 for particles disposed on the mask assembly 815. The particle inspection tool may, for example, reject mask assemblies 815 which have a number of particles disposed on them which is greater than a given particle threshold.

In some embodiments the pellicle frame attachment apparatus 657 may include a pattern inspection system which inspects the pattern on the patterning device for any defects. The pattern inspection system may inspect the pattern on the patterning device before and/or after the pellicle frame 817 is attached to the patterning device MA.

The attachment of the pellicle frame 817 to the patterning device MA may be controlled so as to achieve a desirable tension in the pellicle 819. For example, the tension in the pellicle 819 may be measured during attachment of the pellicle frame 817 to the patterning device MA and the tension may be adjusted in response to the measurement in order to achieve a desired tension in the pellicle 819.

The mask assembly 815 which is assembled by the pellicle frame attachment apparatus 657 is transported from the pellicle frame attachment apparatus 815 to the lithographic apparatus LA by the mask assembly transport device 753 so as to provide the lithographic apparatus LA with the mask assembly 815. The mask assembly transport device 753 may comprise a sealed and clean environment in which the mask assembly 815 is transported so as to reduce the chances of the mask assembly 815 being contaminated or damaged during transport of the mask assembly 815. The sealed and clean environment may, for example, be pumped to a vacuum.

The lithographic apparatus LA may, for example, be similar to the lithographic apparatus LA which is depicted in FIG. 1. The lithographic apparatus LA may include components which are configured to receive a mask assembly 815 from the mask assembly transport device 753 and load the mask assembly 815 onto a support structure MT of the lithographic apparatus LA. The mask assembly 815 may be illuminated with a conditioned radiation beam B provided by an illumination system IL. The patterning device MA of the mask assembly 815 may impart the conditioned radiation beam with a pattern in its cross-section to form a patterned radiation beam. The patterned radiation beam may be projected by a projection system PS onto a substrate W held by a substrate table WT. The conditioned radiation beam may, for example, comprise EUV radiation. In embodiments in which the conditioned radiation beam comprises EUV radiation the pellicle 819 of the mask assembly 815 is substantially transparent to EUV radiation.

In some embodiments a pellicle assembly 816 is attached to a patterning device MA so as to form a mask assembly 815 under vacuum conditions in the pellicle frame attachment apparatus 657. The mask assembly 815 may subsequently be transported to the lithographic apparatus LA under vacuum conditions by the mask assembly transport device 753 and may be held under vacuum conditions in the lithographic apparatus LA. The mask assembly 815 may therefore be exposed to approximately the same pressure conditions throughout its assembly in the pellicle frame attachment apparatus 657 and use in the lithographic apparatus LA. This advantageously reduces any pressure changes to which the mask assembly 815 is exposed and therefore reduces any pressure differences which may develop across the pellicle 819. If a mask assembly 815 is exposed to relatively stable pressure conditions (e.g. by holding the mask assembly 815 in a vacuum throughout its assembly and use) then the need to provide means for an airflow into and out of the volume between the pellicle 819 and the patterning device MA in order to allow for pressure equalization across the pellicle 819 is reduced. This may, for example, allow a number and/or size of filters and/or holes which are provided in a pellicle frame 817 to be reduced thereby advantageously simplifying the design of the pellicle frame 817.

In some embodiments the patterning device MA and/or the pellicle 819 may be inspected for particles and/or defects in the pellicle frame attachment apparatus 657 whilst the components are held in a vacuum. The patterning device MA and/or the pellicle 819 are therefore advantageously inspected under similar pressure conditions to those to which they are exposed during use in the lithographic apparatus LA. This is advantageous since any particles which may be deposited onto patterning device MA and/or the pellicle during pumping down to vacuum conditions may be detected in the pellicle frame attachment apparatus 657.

In some embodiments the lithographic system LS may further comprise a separate inspection apparatus (not shown) which is configured to inspect one or more components of a mask assembly 815 for particles and/or defects. A mask assembly 815 may, for example, be transported to an inspection apparatus (e.g. by the mask assembly transport device 753) after being assembled in the pellicle frame attachment apparatus 657 and prior to transporting the mask assembly 815 to the lithographic apparatus LA.

Embodiments of a lithographic system LS which have been described above advantageously allow a mask assembly 815 to be assembled and passed to a lithographic apparatus in an automated process. The assembly and transport of the mask assembly 815 may all be conducted in a sealed clean environment which may, for example, be pumped to vacuum pressure conditions. This may reduce the chance of components of the mask assembly 815 from being contaminated or damaged prior to the use of the mask assembly 815 in a lithographic apparatus LA.

In general, the useful lifetime of a pellicle 819 may be less than the useful lifetime of a patterning device MA. It may therefore be desirable to remove a pellicle 819 from patterning device MA and replace the pellicle with a new pellicle so as to allow for repeated used of the patterning device MA. Replacement of a pellicle 819 may, for example, be carried out in the pellicle frame attachment apparatus 657. For example, after use in the lithographic apparatus LA a mask assembly 815 may be passed back to the pellicle frame attachment apparatus 657 by the mask assembly transport device 753 for pellicle replacement in the pellicle frame attachment apparatus 657. During replacement of a pellicle 819, the patterning device MA may be subjected to a cleaning process so as to remove any contamination from the patterning device MA. The pellicle frame 817 may, for example, remain attached to the patterning device MA during cleaning of the patterning device or may be removed from the patterning device MA prior to cleaning of the patterning device MA. In alternative embodiments a third tool (not shown) may be provided in which a pellicle 819 is replaced.

Whilst embodiments of a pellicle have been described above in which the pellicle includes a border portion having an increased thickness relative to the rest of the pellicle, some embodiments of a pellicle may not include a border portion having an increased thickness relative to the rest of the pellicle. Unless explicitly stated otherwise any reference, in this document, to a pellicle should therefore be understood to include pellicles which do not have a border portion having an increased thickness relative to the rest of the pellicle.

Various inventive aspects of a mask assembly have been described above and are shown in the figures in the context of specific embodiments of the invention. It will be appreciated that any of these aspects may be combined in a single embodiment. For example, one or more features of one embodiment may be combined with one or more features of another embodiment. It will further be appreciated that whilst some embodiments have been described that include more than one inventive aspect, embodiments that comprise only a single inventive aspect are also contemplated herein. In general any of the features of any of the described embodiments may be used in isolation or may be used in any combination with any of the other features of the described embodiments.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below,

The invention claimed is:

1. A mask assembly suitable for use in a lithographic process, the mask assembly comprising:
   a patterning device; and
   (a) a pellicle frame configured to support a pellicle and mounted on the patterning device with a mount;
   (b) wherein the mount is configured to suspend the pellicle frame relative to the patterning device such that there is a gap between the pellicle frame and the patterning device; and
   wherein the mount provides a releasably engageable attachment between the patterning device and the pellicle frame.

2. The mask assembly of claim 1, wherein the mount provides a kinematic connection between the pellicle frame and the patterning device.

3. The mask assembly of claim 1, wherein the mount comprises a plurality of sub-mounts.

4. The mask assembly of claim 3, wherein each sub-mount is a kinematic sub-mount.

5. The mask assembly of claim 3, wherein each sub-mount includes a resilient component configured to allow movement of a section of the pellicle frame relative to the patterning device at that sub-mount.

6. The mask assembly of claim 5, wherein each sub-mount is configured to restrain the movement of the pellicle frame at that sub-mount relative to the patterning device to a limited number of degrees of freedom such that movement in at least one direction is prevented at that sub-mount.

7. The mask assembly of claim 3, wherein each sub-mount comprises a protrusion attached to one of the patterning devices or the pellicle frame and an engagement mechanism attached to the other of the patterning device or the pellicle frame, the engagement mechanism being configured to receive and engage with the protrusion.

8. The mask assembly of claim 7, wherein the engagement mechanism comprises one or more resilient members configured to allow some movement of the engagement mechanism relative to the protrusion.

9. The mask assembly of claim 7, wherein the engagement mechanism comprises a locking member which is connected to the pellicle frame or the patterning device by one or more arms.

10. The mask assembly of claim 9, wherein the one or more arms extend generally parallel to a plane of the pellicle frame or the patterning device.

11. The mask assembly of claim 9, wherein the one or more arms of a first engagement mechanism extend generally parallel to an edge of the pellicle frame or the patterning device, and the one or more arms of a second engagement mechanism extend generally perpendicular to an edge of the pellicle frame or the patterning device.

12. The mask assembly of claim 9, wherein the locking member is connected to the pellicle frame or the patterning device by two arms.

13. The mask assembly of claim 9, wherein the protrusion comprises a distal head provided on a shaft, and wherein the locking member is configured to engage with the shaft below the distal head.

14. The mask assembly of claim 13, wherein the locking member comprises a pair of springs with unsecured ends moveable from a first locked position beneath the distal head of the protrusion to a second unlocked position not beneath the distal head of the protrusion.

15. The mask assembly of claim 14, wherein the unsecured ends of the springs are resiliently biased to be beneath the distal head of the protrusion.

16. The mask assembly of claim 15, wherein the unsecured ends of the springs are resiliently biased not to contact the shaft of the protrusion.

17. The mask assembly of claim 14, wherein the locking member further comprises a member resiliently biased to press the unsecured ends of the springs against the distal head of the protrusion.

18. The mask assembly of claim 17, wherein the member is a connecting member which extends between a pair of resilient arms.

19. The mask assembly of claim 18, wherein the resilient arms are configured to flex in a direction which is generally perpendicular to a patterned surface of the patterning device.

20. The mask assembly of claim 18, wherein the resilient arms are configured not to flex in directions which are generally parallel to a patterned surface of the patterning device.

21. The mask assembly of claim 13, wherein the locking member is resiliently deformable to allow it to pass over the distal head and engage with the shaft of the protrusion.

22. The mask assembly of claim 9, wherein the locking member comprises a locking plate mounted on a support, the locking plate being moveable to a position in which a recess in the locking plate engages with the shaft below the distal head.

23. The mask assembly of claim 9, wherein the locking member comprises a pair of engagement arms each provided with an inwardly projecting engagement tab at a distal end, the engagement tabs engaging with the distal head of the protrusion and the engagement arms being resiliently deformable in a direction away from the distal head of the protrusion.

24. The mask assembly of claim 23, wherein the engagement arms of each locking member of each sub-mount all extend in substantially the same direction.

25. The mask assembly of claim 23, wherein the engagement arms all extend in a direction which corresponds with a non-scanning direction of the lithographic apparatus.

26. The mask assembly of claim 24, wherein the engagement arms of a first engagement mechanism extend generally parallel to the one or more arms of that engagement mechanism, and the engagement arms of a second engagement mechanism extend generally perpendicular to the one or more arms of that engagement mechanism.

27. The mask assembly of claim 23, wherein the engagement arms are resiliently biased to press the engagement tabs against the distal head of the protrusion.

28. The mask assembly of claim 23, wherein the engagement arms are configured not to flex in directions which are generally parallel to a patterned surface of the patterning device.

29. The mask assembly of claim 7, wherein the engagement mechanism further comprises a movement limiting component which prevents the pellicle frame from contacting the patterning device.

30. The mask assembly of claim 7, wherein the engagement mechanism further comprises a movement limiting component which maintains the gap between the pellicle frame and the patterning device.

31. The mask assembly of claim 28, wherein the movement limiting component comprises a cap configured to engage with a distal surface of the protrusion.

32. The mask assembly of claim 3, wherein the mount comprises three or more sub-mounts.

33. The mask assembly of claim 32, wherein the mount comprises four sub-mounts.

34. The mask assembly of claim 33, wherein two sub-mounts are provided on one side of the mask assembly and two sub-mounts are provided on an opposite side of the mask assembly.

35. The mask assembly of claim 3, wherein each side of the pellicle frame is provided with a sub-mount which allows movement in a first direction and a sub-mount which allows movement in a second direction which is substantially perpendicular to the first direction.

36. The mask assembly of claim 35, wherein the sub-mounts are provided as complementary pairs at equivalent positions on opposite sides of the pellicle frame.

37. The mask assembly of claim 1, wherein the gap between the pellicle frame and the patterning device is at least 100 microns.

38. The mask assembly of claim 1, wherein the gap between the pellicle frame and the patterning device is less than 300 microns.

39. The mask assembly of claim 1, wherein the gap between the pellicle frame and the patterning device is between 200 microns and 300 microns.

40. The mask assembly of claim 3, wherein the gap between the pellicle frame and the patterning device is smaller in the vicinity of a sub-mount than at other locations.

41. The mask assembly of claim 40, wherein the gap in the vicinity of the sub-mount is less than 200 µm.

42. The mask assembly of claim 41, wherein the gap in the vicinity of the sub-mount is around 100 µm or less.

43. A mask assembly for use in a lithographic apparatus, the mask assembly comprising:
a patterning device; and
a pellicle frame configured to support a pellicle and mounted on the patterning device with a mount;
wherein the mount is configured such that the pellicle frame is suspended relative to the patterning device; and wherein the mount provides a releasable attachment between the patterning device and the pellicle frame, the mount comprising:
- a protrusion attached to one of the patterning devices or the pellicle frame, and
- an engagement mechanism configured to engage with the protrusion, the engagement mechanism comprising resiliently deformable arms, wherein the resiliently deformable arms are arranged such that in an open conformation allow shifting of the protrusion to a locking position of the engagement mechanism, and in a closed conformation engage with the protrusion, thereby locking the protrusion in the locking position of the engagement mechanism.

44. A mask assembly according to claim 43, wherein the shifting of the protrusion to the locking position of the engagement mechanism is without mechanical sliding contact with the protrusion.

* * * * *